United States Patent
Wan et al.

(10) Patent No.: US 12,154,628 B2
(45) Date of Patent: Nov. 26, 2024

(54) MEMORY DEVICE, MEMORY SYSTEM, AND METHOD OF OPERATING THE SAME

(71) Applicant: YANGTZE MEMORY TECHNOLOGIES CO., LTD., Wuhan (CN)

(72) Inventors: Weijun Wan, Wuhan (CN); Yue Sheng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 163 days.

(21) Appl. No.: 18/081,035

(22) Filed: Dec. 14, 2022

(65) Prior Publication Data

US 2023/0223085 A1 Jul. 13, 2023

Related U.S. Application Data

(63) Continuation of application No. PCT/CN2022/132824, filed on Nov. 18, 2022.

(30) Foreign Application Priority Data

Jan. 11, 2022 (CN) .......................... 202210028189.X

(51) Int. Cl.
G11C 16/10 (2006.01)
G11C 7/10 (2006.01)
G11C 16/34 (2006.01)

(52) U.S. Cl.
CPC .......... *G11C 16/102* (2013.01); *G11C 7/1039* (2013.01); *G11C 16/3459* (2013.01)

(58) Field of Classification Search
CPC . G11C 16/102; G11C 7/1039; G11C 16/3459; G11C 2211/5621; G11C 7/1087;
(Continued)

(56) References Cited

U.S. PATENT DOCUMENTS 8,086,786 B2 * 12/2011 Chae ...................... G11C 16/10
711/155
9,092,340 B2 * 7/2015 Sprouse .............. G06F 12/0851
(Continued)

FOREIGN PATENT DOCUMENTS

CN 103955430 A * 7/2014
CN 110291586 B * 10/2020 ......... G06F 12/0246
(Continued)

OTHER PUBLICATIONS

International Search Report issued in corresponding International Application No. PCT/CN2022/132854, mailed Feb. 11, 2023, 3 pages.
(Continued)

*Primary Examiner* — Fernando Hidalgo
(74) *Attorney, Agent, or Firm* — BAYES PLLC

(57) ABSTRACT

A peripheral circuit of a memory device is configured to: in the process of programming a first physical page, perform a programming verification to a programming corresponding to the $2^{(N-M)}$ th memory state; when the program verification of the $2^{(N-M)}$ th memory state is passed, identifiers corresponding to the 1st to $2^{(N-M)}$ th memory states stored by the main latch are made different from those corresponding to the $2^{(N-M)}+1$st to $2^N$ th memory states; release at least one of the N page latches to cache program data of at least one logical page of the N logical pages of a second physical page; and the programming data of one logical page in the N logical pages of the second physical page is stored in a released page latch, where M is an integer greater than or equal to 1 and less than or equal to (N−2).

20 Claims, 30 Drawing Sheets

(58) Field of Classification Search
CPC .. G11C 16/0483; G11C 16/10; G11C 11/5628
USPC .................................................. 365/81.035
See application file for complete search history.

(56) References Cited

U.S. PATENT DOCUMENTS

| | | | |
|---|---|---|---|
| 2008/0189478 A1* | 8/2008 | Chae | G06F 12/0246 |
| | | | 711/138 |
| 2010/0023674 A1* | 1/2010 | Aviles | G06F 12/0813 |
| | | | 711/E12.001 |
| 2011/0153911 A1* | 6/2011 | Sprouse | G06F 12/0871 |
| | | | 711/119 |
| 2013/0219109 A1 | 8/2013 | Kim et al. | |
| 2019/0096449 A1 | 3/2019 | Kim | |
| 2020/0319953 A1 | 10/2020 | Kim et al. | |
| 2021/0391026 A1 | 12/2021 | Choi | |

FOREIGN PATENT DOCUMENTS

| | | |
|---|---|---|
| CN | 112154505 A | 12/2020 |
| CN | 113490984 A | 10/2021 |
| CN | 114530181 A | 5/2022 |

OTHER PUBLICATIONS

International Search Report issued in corresponding International Application No. PCT/CN2022/132824, mailed Feb. 14, 2023, 3 pages.

* cited by examiner

| TLC | | LV0 | LV1 | LV2 | LV3 | LV4 | LV5 | LV6 | LV7 |
|---|---|---|---|---|---|---|---|---|---|
| LP | D1 | 1 | 0 | 0 | 0 | 0 | 1 | 1 | 1 |
| MP | D2 | 1 | 1 | 0 | 0 | 1 | 1 | 0 | 0 |
| UP | DC | 1 | 1 | 1 | 0 | 0 | 0 | 0 | 1 |

FIG. 6

| TLC | | LV0 | LV1 | LV2 | LV3 | LV4 | LV5 | LV6 | LV7 |
|---|---|---|---|---|---|---|---|---|---|
| LP | D1 | 1 | 0 | 1 | 0 | 0 | 0 | 1 | 1 |
| MP | D2 | 1 | 0 | 0 | 1 | 0 | 1 | 0 | 1 |
| UP | DC | 1 | 1 | 1 | 1 | 0 | 0 | 0 | 0 |

FIG. 7

| | DS | DL | D1 | D2 | DC |
|---|---|---|---|---|---|
| LV0 | 1 | 1 | 1 | 1 | Next LP |
| LV1 | 1 | 1 | 1 | 1 | Next LP |
| LV2 | 1 | 1 | 1 | 1 | Next LP |
| LV3 | 1 | 1 | 1 | 1 | Next LP |
| LV4 | 0 | 0/1 | 0 | 0 | Next LP |
| LV5 | 0 | 0/1 | 0 | 1 | Next LP |
| LV6 | 0 | 0/1 | 1 | 0 | Next LP |
| LV7 | 0 | 0/1 | 1 | 1 | Next LP |

FIG. 8

|     | DS | DL  | D1      | D2 | DC      |
| --- | -- | --- | ------- | -- | ------- |
| LV0 | 1  | 1   | Next LP | 1  | Next MP |
| LV1 | 1  | 1   | Next LP | 1  | Next MP |
| LV2 | 1  | 1   | Next LP | 1  | Next MP |
| LV3 | 1  | 1   | Next LP | 1  | Next MP |
| LV4 | 1  | 1   | Next LP | 1  | Next MP |
| LV5 | 1  | 1   | Next LP | 1  | Next MP |
| LV6 | 0  | 0/1 | Next LP | 0  | Next MP |
| LV7 | 0  | 0/1 | Next LP | 1  | Next MP |

FIG. 9

| | DS | DL | D1 | D2 | DC |
|---|---|---|---|---|---|
| LV0 | 1 | 1 | Next LP | Next MP | Next UP |
| LV1 | 1 | 1 | Next LP | Next MP | Next UP |
| LV2 | 1 | 1 | Next LP | Next MP | Next UP |
| LV3 | 1 | 1 | Next LP | Next MP | Next UP |
| LV4 | 1 | 1 | Next LP | Next MP | Next UP |
| LV5 | 1 | 1 | Next LP | Next MP | Next UP |
| LV6 | 1 | 1 | Next LP | Next MP | Next UP |
| LV7 | 0 | 0/1 | Next LP | Next MP | Next UP |

FIG. 10

| TLC | | LV0 | LV1 | LV2 | LV3 | LV4 | LV5 | LV6 | LV7 |
|---|---|---|---|---|---|---|---|---|---|
| LP | D1 | 1 | 0 | 1 | 0 | 1 | 0 | 1 | 0 |
| MP | D2 | 1 | 0 | 0 | 1 | 1 | 0 | 0 | 1 |
| UP | DC | 1 | 1 | 1 | 1 | 0 | 0 | 0 | 0 |

FIG. 12

| | DS | DL | D1 | D2 | DC |
|---|---|---|---|---|---|
| LV0 | x | 1 | 1 | 1 | Next LP |
| LV1 | x | 1 | 1 | 1 | Next LP |
| LV2 | x | 1 | 1 | 1 | Next LP |
| LV3 | x | 1 | 1 | 1 | Next LP |
| LV4 | x | 1 | 1 | 1 | Next LP |
| LV5 | x | 0/1 | 0 | 0 | Next LP |
| LV6 | x | 0/1 | 1 | 0 | Next LP |
| LV7 | x | 0/1 | 0 | 1 | Next LP |

FIG. 13

| | DS | DL | D1 | D2 | DC |
|---|---|---|---|---|---|
| LV0 | 1 | 1 | Next LP | 1 | Next MP |
| LV1 | 1 | 1 | Next LP | 1 | Next MP |
| LV2 | 1 | 1 | Next LP | 1 | Next MP |
| LV3 | 1 | 1 | Next LP | 1 | Next MP |
| LV4 | 1 | 1 | Next LP | 1 | Next MP |
| LV5 | 1 | 1 | Next LP | 1 | Next MP |
| LV6 | 0 | 0/1 | Next LP | 0 | Next MP |
| LV7 | 0 | 0/1 | Next LP | 1 | Next MP |

FIG. 14

| | DS | DL | D1 | D2 | DC |
|---|---|---|---|---|---|
| LV0 | 1 | 1 | Next LP | Next MP | Next UP |
| LV1 | 1 | 1 | Next LP | Next MP | Next UP |
| LV2 | 1 | 1 | Next LP | Next MP | Next UP |
| LV3 | 1 | 1 | Next LP | Next MP | Next UP |
| LV4 | 1 | 1 | Next LP | Next MP | Next UP |
| LV5 | 1 | 1 | Next LP | Next MP | Next UP |
| LV6 | 1 | 1 | Next LP | Next MP | Next UP |
| LV7 | 0 | 0/1 | Next LP | Next MP | Next UP |

FIG. 15

| QLC | L0 | L1 | L2 | L3 | L4 | L5 | L6 | L7 | L8 | L9 | L10 | L11 | L12 | L13 | L14 | L15 |
|-----|----|----|----|----|----|----|----|----|----|----|-----|-----|-----|-----|-----|-----|
| LP D1 | 1 | 0 | 1 | 0 | 0 | 1 | 0 | 1 | 0 | 0 | 0 | 0 | 1 | 1 | 1 | 1 |
| MP D2 | 1 | 0 | 0 | 1 | 0 | 1 | 1 | 0 | 0 | 0 | 1 | 1 | 0 | 0 | 1 | 1 |
| UP D3 | 1 | 0 | 0 | 0 | 1 | 0 | 1 | 1 | 0 | 1 | 0 | 1 | 0 | 1 | 0 | 1 |
| XP DC | 1 | 1 | 1 | 1 | 1 | 1 | 1 | 1 | 0 | 0 | 0 | 0 | 0 | 0 | 0 | 0 |

FIG. 16

| | DS | DL | D1 | D2 | D3 | DC |
|---|---|---|---|---|---|---|
| LV0 | 1 | 1 | 1 | 1 | 1 | Next LP |
| LV1 | 1 | 1 | 1 | 1 | 1 | Next LP |
| LV2 | 1 | 1 | 1 | 1 | 1 | Next LP |
| LV3 | 1 | 1 | 1 | 1 | 1 | Next LP |
| LV4 | 1 | 1 | 1 | 1 | 1 | Next LP |
| LV5 | 1 | 1 | 1 | 1 | 1 | Next LP |
| LV6 | 1 | 1 | 1 | 1 | 1 | Next LP |
| LV7 | 1 | 1 | 1 | 1 | 1 | Next LP |
| LV8 | 0 | 0/1 | 0 | 0 | 0 | Next LP |
| LV9 | 0 | 0/1 | 0 | 0 | 1 | Next LP |
| LV10 | 0 | 0/1 | 0 | 1 | 0 | Next LP |
| LV11 | 0 | 0/1 | 1 | 1 | 1 | Next LP |
| LV12 | 0 | 0/1 | 1 | 0 | 0 | Next LP |
| LV13 | 0 | 0/1 | 1 | 0 | 1 | Next LP |
| LV14 | 0 | 0/1 | 1 | 1 | 0 | Next LP |
| LV15 | 0 | 0/1 | 1 | 1 | 1 | Next LP |

FIG. 17

|      | DS | DL  | D1      | D2 | D3 | DC      |
| ---- | -- | --- | ------- | -- | -- | ------- |
| LV0  | 1  | 1   | Next LP | 1  | 1  | Next MP |
| LV1  | 1  | 1   | Next LP | 1  | 1  | Next MP |
| LV2  | 1  | 1   | Next LP | 1  | 1  | Next MP |
| LV3  | 1  | 1   | Next LP | 1  | 1  | Next MP |
| LV4  | 1  | 1   | Next LP | 1  | 1  | Next MP |
| LV5  | 1  | 1   | Next LP | 1  | 1  | Next MP |
| LV6  | 1  | 1   | Next LP | 1  | 1  | Next MP |
| LV7  | 1  | 1   | Next LP | 1  | 1  | Next MP |
| LV8  | 1  | 1   | Next LP | 1  | 1  | Next MP |
| LV9  | 1  | 1   | Next LP | 1  | 1  | Next MP |
| LV10 | 1  | 1   | Next LP | 1  | 1  | Next MP |
| LV11 | 1  | 1   | Next LP | 1  | 1  | Next MP |
| LV12 | 0  | 0/1 | Next LP | 0  | 0  | Next MP |
| LV13 | 0  | 0/1 | Next LP | 0  | 1  | Next MP |
| LV14 | 0  | 0/1 | Next LP | 1  | 0  | Next MP |
| LV15 | 0  | 0/1 | Next LP | 1  | 1  | Next MP |

FIG. 18

|  | DS | DL | D1 | D2 | D3 | DC |
|---|---|---|---|---|---|---|
| LV0 | 1 | 1 | Next LP | Next MP | 1 | Next UP |
| LV1 | 1 | 1 | Next LP | Next MP | 1 | Next UP |
| LV2 | 1 | 1 | Next LP | Next MP | 1 | Next UP |
| LV3 | 1 | 1 | Next LP | Next MP | 1 | Next UP |
| LV4 | 1 | 1 | Next LP | Next MP | 1 | Next UP |
| LV5 | 1 | 1 | Next LP | Next MP | 1 | Next UP |
| LV6 | 1 | 1 | Next LP | Next MP | 1 | Next UP |
| LV7 | 1 | 1 | Next LP | Next MP | 1 | Next UP |
| LV8 | 1 | 1 | Next LP | Next MP | 1 | Next UP |
| LV9 | 1 | 1 | Next LP | Next MP | 1 | Next UP |
| LV10 | 1 | 1 | Next LP | Next MP | 1 | Next UP |
| LV11 | 1 | 1 | Next LP | Next MP | 1 | Next UP |
| LV12 | 1 | 1 | Next LP | Next MP | 1 | Next UP |
| LV13 | 1 | 1 | Next LP | Next MP | 1 | Next UP |
| LV14 | 0 | 0/1 | Next LP | Next MP | 0 | Next UP |
| LV15 | 0 | 0/1 | Next LP | Next MP | 1 | Next UP |

FIG. 19

| | DS | DL | D1 | D2 | D3 | DC |
|---|---|---|---|---|---|---|
| LV0 | 1 | 1 | Next LP | Next MP | Next UP | Next XP |
| LV1 | 1 | 1 | Next LP | Next MP | Next UP | Next XP |
| LV2 | 1 | 1 | Next LP | Next MP | Next UP | Next XP |
| LV3 | 1 | 1 | Next LP | Next MP | Next UP | Next XP |
| LV4 | 1 | 1 | Next LP | Next MP | Next UP | Next XP |
| LV5 | 1 | 1 | Next LP | Next MP | Next UP | Next XP |
| LV6 | 1 | 1 | Next LP | Next MP | Next UP | Next XP |
| LV7 | 1 | 1 | Next LP | Next MP | Next UP | Next XP |
| LV8 | 1 | 1 | Next LP | Next MP | Next UP | Next XP |
| LV9 | 1 | 1 | Next LP | Next MP | Next UP | Next XP |
| LV10 | 1 | 1 | Next LP | Next MP | Next UP | Next XP |
| LV11 | 1 | 1 | Next LP | Next MP | Next UP | Next XP |
| LV12 | 1 | 1 | Next LP | Next MP | Next UP | Next XP |
| LV13 | 1 | 1 | Next LP | Next MP | Next UP | Next XP |
| LV14 | 1 | 1 | Next LP | Next MP | Next UP | Next XP |
| LV15 | 0 | 0/1 | Next LP | Next MP | Next UP | Next XP |

FIG. 20

| QLC | L0 | L1 | L2 | L3 | L4 | L5 | L6 | L7 | L8 | L9 | L10 | L11 | L12 | L13 | L14 | L15 |
|-----|----|----|----|----|----|----|----|----|----|----|-----|-----|-----|-----|-----|-----|
| LP D1 | 1 | 0 | 1 | 0 | 0 | 1 | 0 | 1 | 1 | 0 | 0 | 0 | 0 | 1 | 1 | 1 |
| MP D2 | 1 | 0 | 0 | 1 | 0 | 1 | 1 | 0 | 1 | 0 | 0 | 1 | 1 | 0 | 0 | 1 |
| UP D3 | 1 | 0 | 0 | 0 | 1 | 0 | 1 | 1 | 1 | 0 | 1 | 0 | 1 | 0 | 1 | 0 |
| XP DC | 1 | 1 | 1 | 1 | 1 | 1 | 1 | 1 | 0 | 0 | 0 | 0 | 0 | 0 | 0 | 0 |

FIG. 21

|      | DS | DL  | D1 | D2 | D3 | DC      |
| ---- | -- | --- | -- | -- | -- | ------- |
| LV0  | x  | 1   | 1  | 1  | 1  | Next LP |
| LV1  | x  | 1   | 1  | 1  | 1  | Next LP |
| LV2  | x  | 1   | 1  | 1  | 1  | Next LP |
| LV3  | x  | 1   | 1  | 1  | 1  | Next LP |
| LV4  | x  | 1   | 1  | 1  | 1  | Next LP |
| LV5  | x  | 1   | 1  | 1  | 1  | Next LP |
| LV6  | x  | 1   | 1  | 1  | 1  | Next LP |
| LV7  | x  | 1   | 1  | 1  | 1  | Next LP |
| LV8  | x  | 1   | 1  | 1  | 1  | Next LP |
| LV9  | x  | 0/1 | 0  | 0  | 0  | Next LP |
| LV10 | x  | 0/1 | 0  | 0  | 1  | Next LP |
| LV11 | x  | 0/1 | 0  | 1  | 0  | Next LP |
| LV12 | x  | 0/1 | 0  | 1  | 1  | Next LP |
| LV13 | x  | 0/1 | 1  | 0  | 0  | Next LP |
| LV14 | x  | 0/1 | 1  | 0  | 1  | Next LP |
| LV15 | x  | 0/1 | 1  | 1  | 0  | Next LP |

FIG. 22

| | DS | DL | D1 | D2 | D3 | DC |
|---|---|---|---|---|---|---|
| LV0 | x | 1 | Next LP | 1 | 1 | Next MP |
| LV1 | x | 1 | Next LP | 1 | 1 | Next MP |
| LV2 | x | 1 | Next LP | 1 | 1 | Next MP |
| LV3 | x | 1 | Next LP | 1 | 1 | Next MP |
| LV4 | x | 1 | Next LP | 1 | 1 | Next MP |
| LV5 | x | 1 | Next LP | 1 | 1 | Next MP |
| LV6 | x | 1 | Next LP | 1 | 1 | Next MP |
| LV7 | x | 1 | Next LP | 1 | 1 | Next MP |
| LV8 | x | 1 | Next LP | 1 | 1 | Next MP |
| LV9 | x | 1 | Next LP | 1 | 1 | Next MP |
| LV10 | x | 1 | Next LP | 1 | 1 | Next MP |
| LV11 | x | 1 | Next LP | 1 | 1 | Next MP |
| LV12 | x | 1 | Next LP | 1 | 1 | Next MP |
| LV13 | x | 0/1 | Next LP | 0 | 0 | Next MP |
| LV14 | x | 0/1 | Next LP | 0 | 1 | Next MP |
| LV15 | x | 0/1 | Next LP | 1 | 0 | Next MP |

FIG. 23

|  | DS | DL | D1 | D2 | D3 | DC |
|---|---|---|---|---|---|---|
| LV0 | 1 | 1 | Next LP | Next MP | 1 | Next UP |
| LV1 | 1 | 1 | Next LP | Next MP | 1 | Next UP |
| LV2 | 1 | 1 | Next LP | Next MP | 1 | Next UP |
| LV3 | 1 | 1 | Next LP | Next MP | 1 | Next UP |
| LV4 | 1 | 1 | Next LP | Next MP | 1 | Next UP |
| LV5 | 1 | 1 | Next LP | Next MP | 1 | Next UP |
| LV6 | 1 | 1 | Next LP | Next MP | 1 | Next UP |
| LV7 | 1 | 1 | Next LP | Next MP | 1 | Next UP |
| LV8 | 1 | 1 | Next LP | Next MP | 1 | Next UP |
| LV9 | 1 | 1 | Next LP | Next MP | 1 | Next UP |
| LV10 | 1 | 1 | Next LP | Next MP | 1 | Next UP |
| LV11 | 1 | 1 | Next LP | Next MP | 1 | Next UP |
| LV12 | 1 | 1 | Next LP | Next MP | 1 | Next UP |
| LV13 | 1 | 1 | Next LP | Next MP | 1 | Next UP |
| LV14 | 0 | 0/1 | Next LP | Next MP | 1 | Next UP |
| LV15 | 0 | 0/1 | Next LP | Next MP | 0 | Next UP |

FIG. 24

| | DS | DL | D1 | D2 | D3 | DC |
|---|---|---|---|---|---|---|
| LV0 | 1 | 1 | Next LP | Next MP | Next UP | Next XP |
| LV1 | 1 | 1 | Next LP | Next MP | Next UP | Next XP |
| LV2 | 1 | 1 | Next LP | Next MP | Next UP | Next XP |
| LV3 | 1 | 1 | Next LP | Next MP | Next UP | Next XP |
| LV4 | 1 | 1 | Next LP | Next MP | Next UP | Next XP |
| LV5 | 1 | 1 | Next LP | Next MP | Next UP | Next XP |
| LV6 | 1 | 1 | Next LP | Next MP | Next UP | Next XP |
| LV7 | 1 | 1 | Next LP | Next MP | Next UP | Next XP |
| LV8 | 1 | 1 | Next LP | Next MP | Next UP | Next XP |
| LV9 | 1 | 1 | Next LP | Next MP | Next UP | Next XP |
| LV10 | 1 | 1 | Next LP | Next MP | Next UP | Next XP |
| LV11 | 1 | 1 | Next LP | Next MP | Next UP | Next XP |
| LV12 | 1 | 1 | Next LP | Next MP | Next UP | Next XP |
| LV13 | 1 | 1 | Next LP | Next MP | Next UP | Next XP |
| LV14 | 1 | 1 | Next LP | Next MP | Next UP | Next XP |
| LV15 | 0 | 0/1 | Next LP | Next MP | Next UP | Next XP |

FIG. 25

| | DS | DL | D1 | D2 | DC |
|---|---|---|---|---|---|
| LV0 | x | 1 | Next LP | 1 | Next MP |
| LV1 | x | 1 | Next LP | 1 | Next MP |
| LV2 | x | 1 | Next LP | 1 | Next MP |
| LV3 | x | 1 | Next LP | 1 | Next MP |
| LV4 | x | 1 | Next LP | 1 | Next MP |
| LV5 | x | 1 | Next LP | 1 | Next MP |
| LV6 | x | 0 | Next LP | 0 | Next MP |
| LV7 | x | 0 | Next LP | 1 | Next MP |

FIG. 26

| DS | DL | D1 | D2 | DC |
|---|---|---|---|---|
| LV0 | x | 1 | Next LP | Next MP | Next UP |
| LV1 | x | 1 | Next LP | Next MP | Next UP |
| LV2 | x | 1 | Next LP | Next MP | Next UP |
| LV3 | x | 1 | Next LP | Next MP | Next UP |
| LV4 | x | 1 | Next LP | Next MP | Next UP |
| LV5 | x | 1 | Next LP | Next MP | Next UP |
| LV6 | x | 1 | Next LP | Next MP | Next UP |
| LV7 | x | 0 | | Next MP | Next UP |

FIG. 27

| | DS | DL | D1 | D2 | D3 | DC |
|---|---|---|---|---|---|---|
| LV0 | x | 1 | Next LP | Next MP | 1 | Next UP |
| LV1 | x | 1 | Next LP | Next MP | 1 | Next UP |
| LV2 | x | 1 | Next LP | Next MP | 1 | Next UP |
| LV3 | x | 1 | Next LP | Next MP | 1 | Next UP |
| LV4 | x | 1 | Next LP | Next MP | 1 | Next UP |
| LV5 | x | 1 | Next LP | Next MP | 1 | Next UP |
| LV6 | x | 1 | Next LP | Next MP | 1 | Next UP |
| LV7 | x | 1 | Next LP | Next MP | 1 | Next UP |
| LV8 | x | 1 | Next LP | Next MP | 1 | Next UP |
| LV9 | x | 1 | Next LP | Next MP | 1 | Next UP |
| LV10 | x | 1 | Next LP | Next MP | 1 | Next UP |
| LV11 | x | 1 | Next LP | Next MP | 1 | Next UP |
| LV12 | x | 1 | Next LP | Next MP | 1 | Next UP |
| LV13 | x | 1 | Next LP | Next MP | 1 | Next UP |
| LV14 | x | 0/1 | Next LP | Next MP | 1 | Next UP |
| LV15 | x | 0/1 | Next LP | Next MP | 0 | Next UP |

FIG. 29

| | DS | DL | D1 | D2 | D3 | DC |
|---|---|---|---|---|---|---|
| LV0 | x | 1 | Next LP | Next MP | Next UP | Next XP |
| LV1 | x | 1 | Next LP | Next MP | Next UP | Next XP |
| LV2 | x | 1 | Next LP | Next MP | Next UP | Next XP |
| LV3 | x | 1 | Next LP | Next MP | Next UP | Next XP |
| LV4 | x | 1 | Next LP | Next MP | Next UP | Next XP |
| LV5 | x | 1 | Next LP | Next MP | Next UP | Next XP |
| LV6 | x | 1 | Next LP | Next MP | Next UP | Next XP |
| LV7 | x | 1 | Next LP | Next MP | Next UP | Next XP |
| LV8 | x | 1 | Next LP | Next MP | Next UP | Next XP |
| LV9 | x | 1 | Next LP | Next MP | Next UP | Next XP |
| LV10 | x | 1 | Next LP | Next MP | Next UP | Next XP |
| LV11 | x | 1 | Next LP | Next MP | Next UP | Next XP |
| LV12 | x | 1 | Next LP | Next MP | Next UP | Next XP |
| LV13 | x | 1 | Next LP | Next MP | Next UP | Next XP |
| LV14 | x | 1 | Next LP | Next MP | Next UP | Next XP |
| LV15 | x | 0/1 | Next LP | Next MP | Next UP | Next XP |

FIG. 30

MEMORY DEVICE, MEMORY SYSTEM, AND METHOD OF OPERATING THE SAME

CROSS-REFERENCE TO RELATED APPLICATIONS

This application is a continuation of Internal Application No. PCT/CN2022/132824, filed Nov. 18, 2022, entitled "MEMORY DEVICE, MEMORY SYSTEM, AND METHOD OF OPERATING THE SAME," which claims the benefit of priority to Chinese Application No. 202210028189.X, filed on Jan. 11, 2022, both of which are incorporated by reference herein in their entireties.

BACKGROUND

The present disclosure relates to a memory device, a memory system, and a method of operating the same.

In a non-volatile memory device, the written data is first quickly stored in the cache latch, and then moved to the data latch. In one programming process of writing data into the physical memory cell array of the memory device, only one page data can be transfer from the cache latch to the data latch. As such, when the number of data pages written into the physical memory cell array by programming is more than one, it is necessary to wait for the end of the programming, and then move the page data from the cache latch to the data latch separately. Therefore, the process of writing data to the memory cell array is inefficient and cannot provide continuous programming.

SUMMARY

In one aspect, a memory device includes a memory cell array. The memory cells in the memory cell array are arranged in rows and columns, and each memory cell is set to one of $2^N$ levels corresponding to a piece of N-bits data, where N is an integer greater than 1. The memory device further includes a peripheral circuit coupled to the memory cell array and configured to: perform first programming and second programming sequentially and respectively on the memory cell array in a first physical page and a second physical page in a cache programming manner, and program at least a selected row of the memory cells based on N logical pages of the first physical page and the second physical page during the first programming and the second programming. The peripheral circuit includes page buffers respectively coupled to bit lines. Each page buffer includes a main latch, (N−1) data latches, and a cache latch coupled to a data path. The main latch is configured to store first non-physical page information, and the (N−1) data latches and the cache latch are configured to, during a process of programming to the N logical pages of the first physical page and the second physical page, function as N page latches to temporarily store programming data to be written into the N logical pages. The peripheral circuit is further configured to: in the process of programming the first physical page, perform a programming verification to the programming corresponding to the $2^{(N-M)}$ th memory state; when the program verification of the $2^{(N-M)}$ th memory state is passed, identifiers corresponding to the 1st to $2^{(N-M)}$ th memory states stored by the main latch are made different from those corresponding to the $2^{(N-M)}+1$st to $2^N$ th memory states; release at least one of the N page latches to cache program data of at least one logical page of the N logical pages of the second physical page; and in the process of programming the first physical page, the programming data of one logical page in the N logical pages of the second physical page is stored in a released page latch, where M is an integer greater than or equal to 1 and less than or equal to (N−2).

In some implementations, the peripheral circuit is further configured to: during the programming of the first physical page and the second physical page, the 1st to $2^{(N-M)}$th memory states are programmed using an incremental step pulse programming (ISPP) programming method.

In some implementations, the first non-physical page information includes verification information and programming information.

In some implementations, the peripheral circuit is further configured to: after the program verification is performed on $2^{N-1}$th memory state of the $2^N$ memory states, the identifiers corresponding to the 1st to $2^{(N-1)}$th memory states stored by the main latch are made different from those corresponding to the $2^{(N-1)}+1$st to $2^N$th memory states; or after the program verification of a third-to-last memory state of the $2^N$ memory states, the identifiers corresponding to the 1st to $2^N$_2nd memory states stored by the main latch are made different from those corresponding to the $2^N$-1th to $2^N$th memory states.

In some implementations, the peripheral circuit is also configured to: after the identifiers corresponding to the 1st to $2^{(N-M)}$th memory states stored by the main latch are made different from the identifiers corresponding to the $2^{(N-M)}+1$st to $2^N$th memory states, float the bit line during the process of programming to dump the first non-physical page information in the main latch.

In some implementations, the peripheral circuit is also configured to: before program verification is performed on the $2^{N-1}$th memory state of the $2^N$ memory states, store program data of a corresponding one of the N logical pages of the first physical page in at least one of the N page latches; and after program verification is performed on the $2^{N-1}$th memory state of the $2^N$ memory states, store program data of one of the N logical pages of the second physical page in at least one of the N page latches.

In some implementations, the peripheral circuit is further configured to: after program verifying a second-to-last of the $2^N$ memory states, release the N page latches so that the N page latches cache program data of each of the N logical pages of the second physical page.

In some implementations, each memory cell is configured to store three-bit data. The peripheral circuit is further configured to program the selected row of memory cells based on three logical pages of the first physical page and the second physical page; and two data latches and the cache latch are configured to function as three page latches in the process of performing a programming process on the three logical pages of the first physical page and the second physical page, to temporarily store the programming data to be written into the three logical pages.

In some implementations, each memory cell is configured to store four-bit data. The peripheral circuit is further configured to program the selected row of memory cells based on four logical pages of the first physical page and the second physical page; and three data latches and the cache latch are configured to function as four page latches in the process of performing a programming process on the four logical pages of the first physical page and the second physical page, to temporarily store the programming data to be written into the four logical pages.

In some implementations, each page buffer further includes a bias latch configured to store voltage bias information of a corresponding bit line.

In some implementations, each page buffer further includes: a bias latch coupled to a data path, wherein the bias latch is configured to store second non-physical page information.

In some implementations, the memory device further includes a three-dimensional NAND flash memory device.

In another aspect, a memory device includes a memory cell array. The memory cells in the memory cell array are arranged in rows and columns, and each memory cell is set to one of $2^N$ levels corresponding to a piece of N-bits data, where N is an integer greater than 1. The memory device further includes a peripheral circuit coupled to the memory cell array and configured to: perform first programming and second programming sequentially and respectively on the memory cell array in a first physical page and a second physical page in a cache programming manner, and program at least a selected row of the memory cells based on N logical pages of the first physical page and the second physical page during the first programming and the second programming. The peripheral circuit includes page buffers respectively coupled to bit lines. Each page buffer includes a main latch, a bias latch, (N-1) data latches, and a cache latch coupled to a data path. The (N-1) data latches and the cache latch are configured to: during a process of programming to the N logical pages of the first physical page and the second physical page, function as N page latches to temporarily store programming data to be written into the N logical pages. The peripheral circuit is further configured to: in the process of programming the first physical page, perform a programming verification to the programming corresponding to the $2^{(N-M)}+1$st memory state; when the program verification of the $2^{(N-M)}+1$st memory state is passed, release at least one of the N page latches to cache program data of at least one logical page of the N logical pages of the second physical page; and in the process of programming the first physical page, the programming data of one logical page in the N logical pages of the second physical page is stored in a released page latch, where M is an integer greater than or equal to 1 and less than or equal to (N-2).

In some implementations, the peripheral circuit is also configured to: after the program verification of a third-to-last memory state of the $2^N$ memory states, float the bit line during the process of programming to dump the first non-physical page information in the main latch, and the identifiers corresponding to the 1st to $2^{N-2}$nd memory states stored by the main latch are made different from those corresponding to $2^{N-1}$st to the $2^N$th memory state.

In some implementations, the peripheral circuit is further configured to: after the program verification of a second-to-last memory state of the $2^N$ memory states, the identifiers corresponding to the 1st to $2^{N-1}$st memory states stored by the main latch are made different from those corresponding to the $2^N$th memory state.

In still another aspect, a method of programming a memory device. The memory device includes a memory cell array and a peripheral circuit coupled to the memory cell array. Memory cells in the memory cell array are arranged in rows and columns, and each memory cell is set to one of $2^N$ levels corresponding to a piece of N-bits data, where N is an integer greater than 1. The peripheral circuit includes a plurality of page buffers coupled to bit lines, respectively. The method includes: storing N logical pages of first physical page corresponding to a current first programming in the N page latches, wherein the N page latches include (N-1) data latches in the page buffers and a cache latch coupled to a data path; storing first non-physical page information in a main latch in the page buffers; in a first programming of a first physical page, performing a program verification on a process of programming corresponding to the $2^{(N-M)}$th memory state; when the program verification of the $2^{(N-M)}$th memory state is passed, making identifiers corresponding to the 1st to $2^{(N-M)}$th memory states stored by the main latch to be different from those corresponding to $2^{(N-M)}+1$st to $2^N$th memory states; releasing at least one of the N page latches to cache program data of at least one logical page of the N logical pages of a second physical page, where M is an integer greater than or equal to 1 and less than or equal to (N-2); and before performing a second programming subsequent to the first programming to the second physical page in the cache programming manner, and in the process of first programming the first physical page, storing the programming data of one of the N logical pages of the second physical page in a released page latch.

In some implementations, performing the first programming and the second programming on the first physical page and the second physical page includes: programming the 1st to $2^{(N-M)}$th memory states by using an incremental step pulse programming (ISPP) programming method.

In some implementations, the first non-physical page information includes verification information and programming information.

In some implementations, when the program verification of the $2^{(N-M)}$th memory state is passed, the identifiers corresponding to the 1st to $2^{(N-M)}$th memory states stored by the main latch to be different from those corresponding to $2^{(N-M)}+1$st to $2^N$th memory states, the method further includes: after the program verification is performed on the $2^{N-1}$st memory state of $2^N$ memory states, the identifiers corresponding to 1st to $2^{(N-1)}$th memory states stored by the main latch are made different from those identifiers corresponding of $2^{(N-1)}+1$st to $2^N$th memory states; or after program verification is performed on the third-to-last memory state of the $2^N$ memory states, the identifiers corresponding to 1st to $2^{N-2}$nd memory states stored in the main latch are made different from those corresponding to $2^{N-1}$th to $2^N$th memory states.

In some implementations, after the identifiers corresponding to the 1st to $2^{(N-M)}$th memory states stored by the main latch to be different from those corresponding to $2^{(N-M)}+1$st to $2^N$th memory states, the method further includes: floating the bit line during the process of programming to dump the first non-physical page information in the main latch.

In some implementations, the method further includes before the program verification is performed on the $2^{N-1}$st memory state of $2^N$ memory states, storing program data of one of the N logical pages of the first physical page in at least one of the N page latches; and after the program verification is performed on the $2^{N-1}$st memory state of $2^N$ memory states, storing program data of one of the N logical pages of the second physical page in at least one of the N page latches.

In some implementations, the method further includes after program verification is performed on the third-to-last memory state of the $2^N$ memory states, release the N page latches, so that the N page latches cache program data of each of the N logical pages of the second physical page.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 6 is a state encoding table in which user data has not been encoded and converted in a page latch according to some implementations of the present disclosure;

FIG. 7 is an encoding state table after encoding and converting programming data of a temporarily stored logical page according to some implementations of the present disclosure;

FIG. 8 is an encoding state table when the LV3 programming verification is passed and the function of the main latch DS is changed according to some implementations of the present disclosure;

FIG. 9 is an encoding state table after LV5 programming verification is passed according to some implementations of the present disclosure;

FIG. 10 is an encoding state table after LV6 programming verification is passed according to some implementations of the present disclosure;

FIG. 12 is an encoding state table after encoding and converting programming data of a temporarily stored logical page according to some implementations of the present disclosure;

FIG. 13 is an encoding state table after LV4 programming verification is passed according to some implementations of the present disclosure;

FIG. 14 is an encoding state table when the LV5 programming verification is passed and the function of the main latch DS is changed according to some implementations of the present disclosure;

FIG. 15 is an encoding state table after LV6 programming verification is passed according to some implementations of the present disclosure;

FIG. 16 is an encoding state table after encoding and converting programming data of a temporarily stored logical page according to some implementations of the present disclosure;

FIG. 17 is an encoding state table when the LV7 programming verification is passed and the function of the main latch DS is changed according to some implementations of the present disclosure;

FIG. 18 is an encoding state table after LV11 programming verification is passed according to some implementations of the present disclosure;

FIG. 19 is an encoding state table when the LV13 programming verification is passed and the function of the main latch DS is changed according to some implementations of the present disclosure;

FIG. 20 is an encoding state table after LV14 programming verification is passed according to some implementations of the present disclosure;

FIG. 21 is an encoding state table after encoding and converting programming data of a temporarily stored logical page according to some implementations of the present disclosure;

FIG. 22 is an encoding state table after LV8 programming verification is passed according to some implementations of the present disclosure;

FIG. 23 is an encoding state table after LV12 programming verification is passed according to some implementations of the present disclosure;

FIG. 24 is an encoding state table when the LV13 programming verification is passed and the function of the main latch DS is changed according to some implementations of the present disclosure;

FIG. 25 is an encoding state table after LV14 programming verification is passed according to some implementations of the present disclosure;

FIG. 26 is an encoding state table when the LV5 programming verification is passed and the bit line bias function is disabled;

FIG. 27 is an encoding state table after the LV6 programming verification is passed according to some implementations of the present disclosure;

FIG. 29 is an encoding state table when the LV13 programming verification is passed and the bit line bias function is disabled according to some implementations of the present disclosure; and FIG. 30 is an encoding state table after LV14 programming verification is passed according to some implementations of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
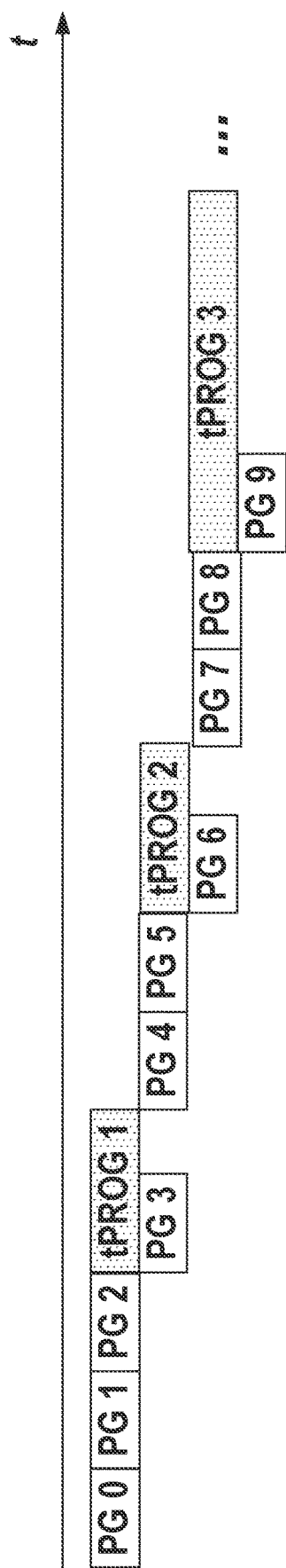
FIG. 1 is a schematic diagram of data writing in a non-volatile memory device according to some implementations of the present disclosure.

In a non-volatile memory device, the written data is first quickly stored in the cache latch, and then moved to the data latch. A schematic diagram of data writing in a non-volatile memory device is shown in FIG. 1. The period of the programming data of one logical page (page 3) of the second physical page being moved into the data latch is hidden in the first programming process. That is, during the first programming process of writing data into the physical array of the flash memory, only the movement of the programming data of one of the three logical pages of the second physical page from the cache latch to the data latch can be realized. As such, when the number of physical pages programmed into the physical array is more than one, it is necessary to wait for the end of the programming, the programming data of the other two logical pages in the second physical page are moved from the cache latch to the data latch separately, which makes the data writing to the memory cell array inefficient, and the programming is not continuous. The solution provided by the present disclosure enables the programming data of various types of logical pages required in the second programming to be temporarily stored in the page latches during the first programming, and there is no need to wait or reduce the wait time when the second programming starts, thereby improving the continuity between programming processes.

Figure 2:
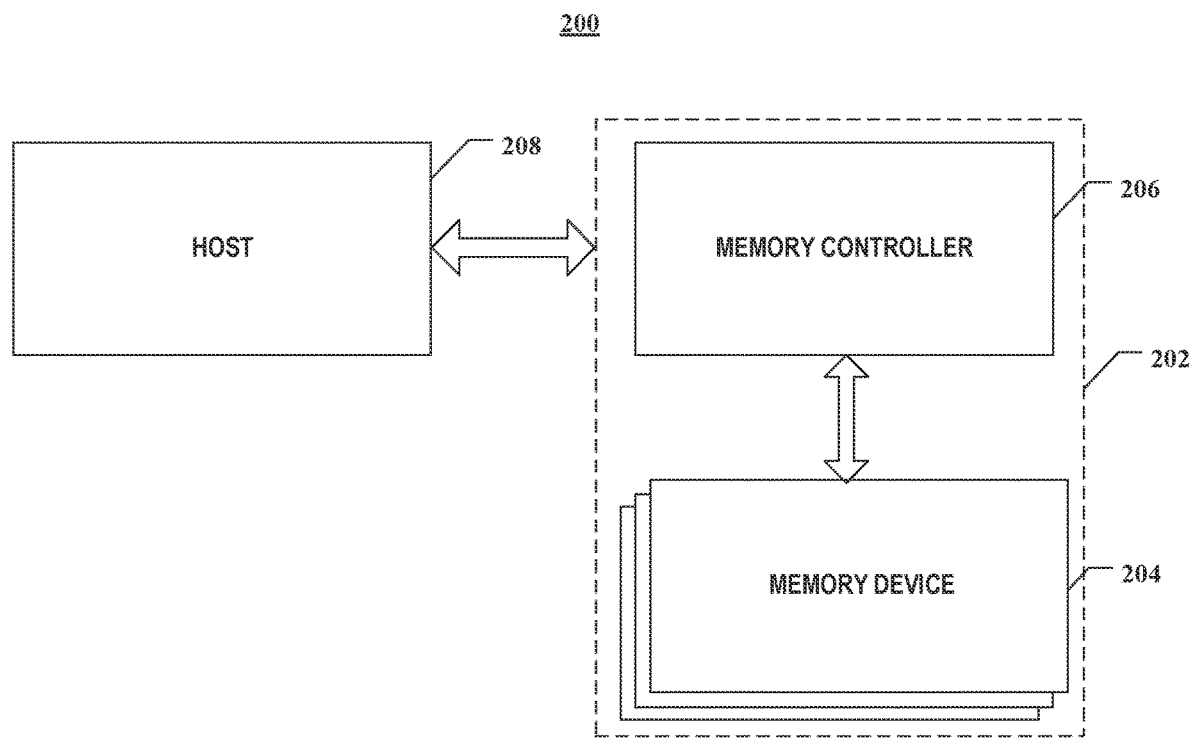
FIG. 2 is a block diagram of a system with a non-volatile memory device according to according to some implementations of the present disclosure.

FIG. 2 shows a block diagram of an exemplary system 200 with non-volatile memory device in accordance with some implementations of the present disclosure. System 200 may be a mobile phone, desktop computer, laptop computer, tablet computer, vehicle computer, game console, printer, pointing device, wearable electronic device, smart sensor, virtual reality (VR) device, augmented reality (AR) device, or any other suitable electronic device with memory device therein. As shown in FIG. 2, system 200 may include a host 208 and a memory system 202 including one or more non-volatile memory devices 204 and a controller 206. Non-volatile memory device 204 includes memory cell array and multiple page buffers. Host 208 may be a processor (e.g., a central processing unit (CPU)) or a system on a chip (SoC) (e.g., an application processor (AP)) of the electronic device. Host 208 may be configured to send data to or receive data from non-volatile memory device 204.

Non-volatile memory device 204 may be any non-volatile memory device disclosed in this disclosure. According to some embodiments, controller 206 is coupled to non-volatile memory device 204 and host 208 and is configured to control the non-volatile memory device. Controller 206 may manage data stored in the non-volatile memory device and communicate with host 208. In some embodiments, controller 206 is designed to operate in a low duty cycle environment, such as a secure digital (SD) card, compact flash (CF) card, universal serial bus (USB) flash drive, or used in electronic devices such as personal calculators, digital cameras, mobile phones, and the like.

In some embodiments, controller 206 is designed to operate in a high duty cycle environment SSD or Embedded Multimedia Card (eMMC) used as a data storage for mobile devices such as a smartphone, tablet, laptop, etc., and an enterprise storage. Controller 206 may be configured to control operations of non-volatile memory device 204, such as read, erase, and program operations. Controller 206 may also be configured to manage various functions with respect to data stored or to be stored in non-volatile memory device 204, including but not limited to bad block management, garbage collection, logical to physical address transfer, and wear leveling. In some implementations, controller 206 is also configured to process error correction codes (ECC) with respect to data read from or written to non-volatile memory device 204. Controller 206 may also perform any other suitable function, such as formatting non-volatile memory device 204. For example, controller 206 may communicate with external devices (e.g., host 208) according to a particular communication protocol. For example, controller 206 may communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc. Controller 206 can specifically be composed of a microprocessor, a microcontroller (also known as a microcontroller unit (MCU)), a central processing unit (CPU), a digital signal processor (DSP), an application-specific integrated circuit (ASIC), field programmable gate arrays (FPGAs), programmable logic devices (PLDs), state machines, gated logic units, discrete hardware circuits, or combinations thereof, and other suitable hardware, firmware, and/or software to achieve.

Figure 3A:
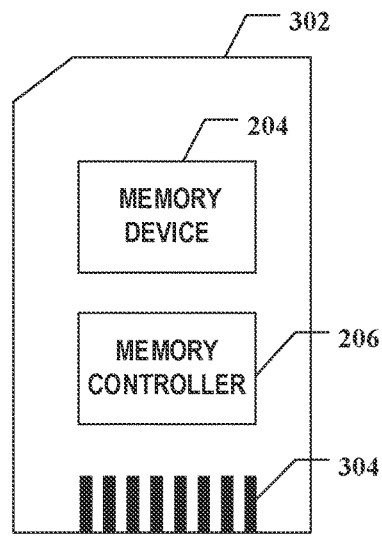
FIG. 3A is a schematic diagram of a memory card according to some implementations of the present disclosure.
Figure 3B:
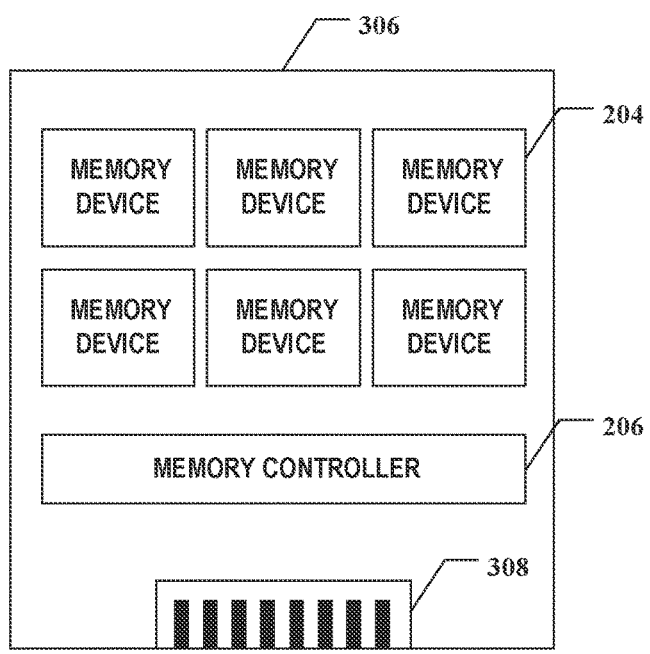
FIG. 3B is a schematic diagram of a solid-state drive (SSD) according to some implementations of the present disclosure.

Controller 206 and one or more non-volatile memory devices 204 may be integrated into various types of memory devices, e.g., included in the same package (e.g., a Universal Flash Storage (UFS) package or an eMMC package). That is, memory system 202 can be implemented and packaged into different types of electronic end products. In one example, as shown in FIG. 3A, controller 206 and a non-volatile memory device 204 may be integrated into memory card 302. Memory card 302 may include a PC card (Personal Computer Memory Card International Association, (PCMCIA)), CF card, Smart Media (SM) card, memory stick, multimedia card (MMC, RS-MMC, MMCmicro), SD card (SD, miniSD, microSD, SDHC), UFS, etc. Memory card 302 may also include a memory card connector 304 that couples to memory card 302 with a host (e.g., host 208 in FIG. 2). In another example, as shown in FIG. 3B, controller 206 and the plurality of non-volatile memory devices 204 may be integrated into SSD 306. SSD 306 may also include an SSD connector 308 that couples to SSD 306 with a host (e.g., host 208 in FIG. 2). In some implementations, the storage capacity and/or operating speed of SSD 306 is greater than the storage capacity and/or operating speed of memory card 302.

Figure 4:
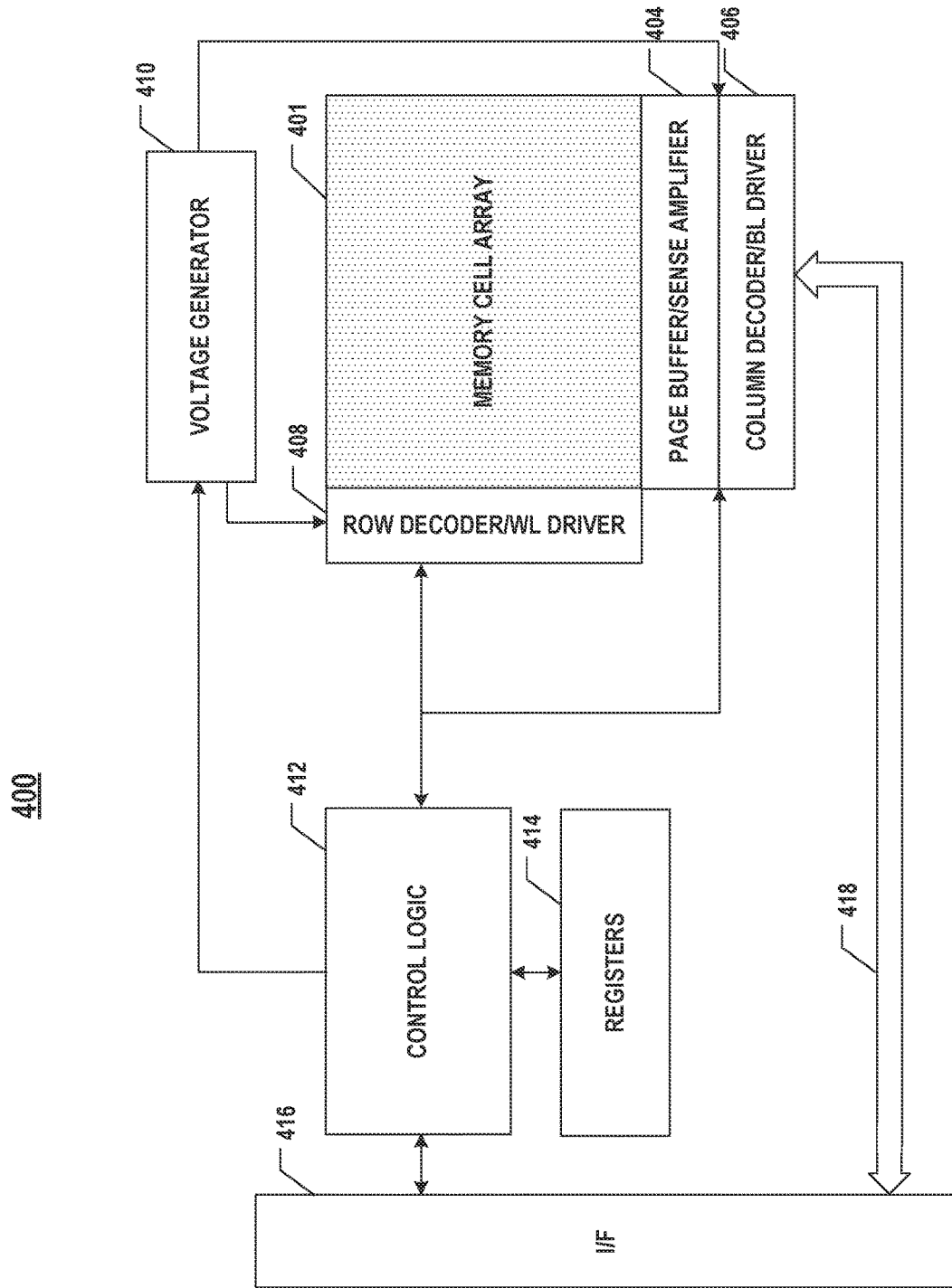
FIG. 4 is a block diagram of a non-volatile memory device including a memory cell array and a peripheral circuit according to some implementations of the present disclosure.

FIG. 4 shows a block diagram of a non-volatile memory device (e.g., non-volatile memory device 204) including a memory cell array 401 and a peripheral circuit 400 according to some implementations of the present disclosure. Peripheral circuit 400 includes a page buffer/sense amplifier 404, a column decoder/bit line (BL) driver 406, row decoder/word line (WL) driver 408, voltage generator 410, control logic 412, registers 414, interface 416, and data bus 418. It should be understood that, in some examples, the additional peripheral circuits (not shown) may also be included according to some implementations of the present disclosure.

Page buffer/sense amplifier 404 may be configured to read data from and program (write) data to memory cell array 401 according to control signals from control logic 412. In one example, page buffer/sense amplifier 404 may store program data (write data, also referred to herein as a "data page") to be programmed into one logical page of one physical page of memory cell array 401). As described in detail below and consistent with the scope of the present disclosure, in a programming operation, page buffer/sense amplifier 404 may include a plurality of page buffers coupled to bit lines, respectively. Each page buffer includes N–1 data latches and a cache latch coupled to the data path for temporarily storing pieces of N-bit data received from data bus 418 and for buffering the fragment of the N–bit data through corresponding bit lines in a cache programming manner to the corresponding selected memory device.

Column decoder/bit line (BL) driver 406 may be configured to be controlled by control logic 412 and select one or more NAND memory strings by applying bit line voltages generated from voltage generator 410. Row decoder/word line (WL) driver 408 may also be configured to drive word lines using word line voltages generated from voltage generator 410. Voltage generator 410 may be configured to be controlled by control logic 412 and generate word line voltages (e.g., read voltages, program voltages, channel pass voltages, local voltages, verify voltages, etc.), bit line voltages, and source line voltages, to be supplied to memory cell array 401.

Referring to FIG. 4, peripheral circuit 400 is configured to perform the first programming process and the second programming process sequentially and respectively on memory cell array 401 by the first physical page and the second physical page in the cache programming manner. And during the first programming/second programming process, based on the N logical pages of the first physical page/the second physical page, the row of the selected memory cell is programmed. In some implementations, the user data is transferred to page buffer/sense amplifier 404 over data bus 418. Page buffer/sense amplifier 404 is configured to convert user data into program data to be programmed into each logical page in the selected row of memory cells based on preset rules. During the ongoing first programming operation, the program data for the N logical pages of the first physical page may be temporarily stored in page buffer/sense amplifier 404.

Figure 5:
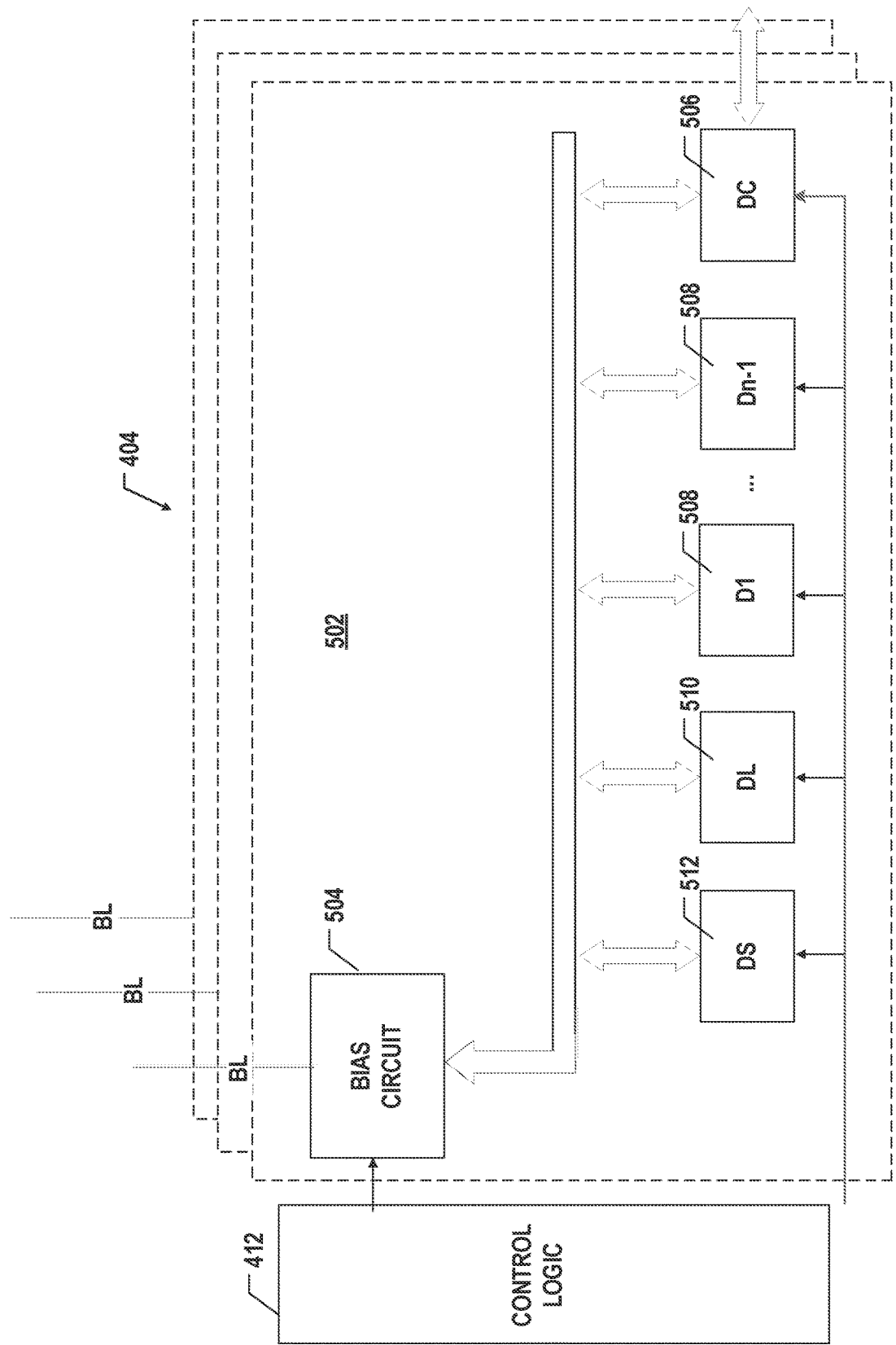
FIG. 5 is a block diagram of a page buffer in a programming operation according to some implementations of the present disclosure.

FIG. 5 shows a detailed block diagram of page buffer/sense amplifier 404 in a programming operation according to some implementations of the present disclosure. In some implementations, page buffer/sense amplifier 404 includes a plurality of page buffer circuits 502. Each page buffer circuit 502 is coupled to a corresponding one of the bit lines BL. In other words, each page buffer circuit 502 may be coupled to a corresponding column of memory cells (e.g., a certain string of memory cells) through a corresponding bit line BL, and configured to temporarily store data for a selected memory cell during a programming operation. The program data of the N logical pages of the first physical page/second physical page of the row of the memory cell is to be programmed. In some implementations, page buffer circuit 502 is also configured to pre-process user data received from data bus 418 (shown in FIG. 4) and convert it to be programmed to the selected program data of N logical pages of the first physical page/second physical page in the row of the memory cell.

As shown in FIG. 5, each page buffer circuit 502 may include (N−1) data latches (D1 to Dn−1) 508 and one cache latch (DC) 506 coupled to the data path. (N−1) data latches 508 and cache latch 506 are used as N page latches to temporarily store programming data to be written into N logical pages in the process of performing one programming process on the N logical pages of the first physical page/second physical page.

Each page buffer circuit 502 may also include a plurality of memory cells for storing non-physical page information, which refers to information other than program data of logical pages in a physical page, and which is different from, for example, programming data of N logical page. The non-physical page information can be used in the programming process to help realize the data programming process of the physical page, which is generally not temporarily stored in the data latch. As shown in FIG. 5, in some implementations, page buffer circuit 502 includes a main latch (DS) 512 configured to store verification information and programming information, and a bias latch (DL) 510 configured to store bias voltage information corresponding bit lines BL. Each page buffer circuit 502 may also include a bias circuit 504. Bias circuit 504 is coupled to respective bit lines BL and is configured to apply bit line voltages to respective selected rows of memory cells coupled to respective bit lines BL during a programming operation.

In some implementations of the present disclosure, the non-volatile memory device includes: a memory cell array having memory cells arranged in rows and columns. Each memory cell is set to one of $2^N$ levels corresponding to a piece of N-bits data, for example, 3-bit data; and a peripheral circuit coupled to the memory cell array and configured to perform a first programming process and a second programming process, respectively, on the memory cell array on the first physical page and the second physical page in a cache programming manner, and program the selected memory cell row based on three logical pages of the first physical page/second physical page in the process of the first programming process/second programming process, where the three logical pages are respectively the Lower Page (LP), Middle Page (MP), Upper Page (UP).

The peripheral circuit includes a plurality of page buffers respectively coupled to the bit lines. Each page buffer includes a main latch DS, two data latches D1, D2, and one cache latch DC coupled to the data path. The main latch DS is configured to store the first non-physical page information; the two data latches D1, D2 and the one cache latch DC are used to function as the three page latches to temporarily store the programming data to be written into the three logical pages in the process of performing a programming process on the three logical pages of the first physical page/the second physical page.

The peripheral circuit is further configured to: in the process of programming the first physical page, when the programming operations of the 1st to $2^{(N-M)}$th memory states are completed, the programming operation performs a program verification operation to the corresponding $2^{(N-M)}$th memory states. And in the case where the program verification of the $2^{(N-M)}$th memory state is passed, the main latch is subjected to a non-target verification, thereby making the identifiers corresponding to the 1st to $2^{(N-M)}$th memory states stored by the main latch being different from the identifiers corresponding to the $2^{(N-M)}+1$st to $2^N$th memory states, and releasing at least one of the N page latches to cache program data of at least one logical page of the N logical pages of the second physical page. And in the process of programming the first physical page, the programming data of one logical page of the N logical pages of the second physical page is stored in a released page latch, where M is an integer greater than or equal to 1 and less than or equal to (N−2) (e.g., for TLC, N=3, M=1). In some implementations, the non-volatile memory device includes a three-dimensional NAND flash memory device.

In some implementations of the present application, the peripheral circuit is further configured to, during programming of the first physical page/second physical page, use an incremental step pulse programming (ISPP) programming method to program the 1st to $2^{(N-M)}$th memory states. In some implementations, e.g., for TLC, N=3, M=1, the peripheral circuit is further configured to perform programming operations on the 1st to $2^2$nd memory states using an incremental step pulse programming (ISPP) programming method during programming of the first physical page/second physical page.

In some implementations, each memory cell has 8 memory states (levels) and thus can be set to one of $2^3$ levels corresponding to three bits of data. Each memory state may correspond to one of a range of threshold voltages (Vth) for the memory cell. On the other hand, each memory state may correspond to one of $2^3$ pieces of three-bit data to be stored in the selected row of memory cells.

In some implementations, referring to FIG. 6, FIG. 6 is a state encoding table in which user data is temporarily stored in the page latch according to some implementations of the present application. An example of a binary encoding of a one-to-one mapping between 8 memory states (LV0 to LV7) and 8 fragments is shown.

Each segment of three-bit data may be composed of three-bit binary codes, and the three-bit binary codes are respectively derived from three logical pages, and the three logical pages are respectively a low page LP, a middle page MP, and a high page UP.

It can be seen that the three page latches store the programming data of the low, middle, and high logical pages in sequence, the page latch D1 stores the low page LP, the page latch D2 stores the middle page MP, and the page latch DC stores the high page UP.

In some implementations, memory state LV1 may correspond to a segment with code 011. In some implementations, memory state LV7 may correspond to another segment with code 101. FIG. 7 is an encoding state table after encoding and converting the programming data of the logical page stored in the page latch according to a preset rule in accordance with some implementations of the present disclosure. After encoding conversion, as shown in FIG. 7, LV1 is encoded from 011 to 001, where codes 011 represent LP/MP/UP in sequence. The encoding sequence of other memory states is also LP/MP/UP. LV2 is encoded from 001 to 101, LV3 is encoded from 000 to 011, LV4 is encoded from 010 to 000, LV5 is encoded from 110 to 010, LV6 is encoded from 100 to 100, and LV7 is encoded from 101 to 110.

In some implementations, the peripheral circuit is further configured to before program verification is performed on the $2^{N-1}$th memory state in the $2^N$th memory states, store the programming data corresponding to one of the N logical pages in the first physical page in at least one of the N page latches.

And after program verification is performed on the $2^{N-1}$th memory state in the $2^N$th memory states, program data of one logical page in the N logical pages of the second physical page is stored in at least one of the N pages latches.

In some implementations, the DC may store programming data of one logical page (current UP) of the three logical pages of the first physical page before the program verification is performed on the fourth memory state LV3 of the eight memory states. The D1 may store programming data of the corresponding logical page (current LP) of the first physical page. The D2 may store programming data of the corresponding logical page (current MP) of the first physical page. After program verification is performed on the fourth memory state LV3 of the eight memory states, programming data of one logical page of the three logical pages of the second physical page is stored in the three page latches. It can be referred to FIG. 8 for more details.

In some implementations, the peripheral circuit is configured to after the program verification is performed on the $2^{N-1}$th memory state in the $2^N$th memory states, the main latch DS is subjected to non-target verification. That is, the identifiers corresponding to the 1st to $2^N-$)th memory states stored by the main latch DS are different from the identifiers corresponding to the $2^{(N-M)}+1$st to $2^N$th memory states. In some implementations, referring to FIG. 8, after program verification of the 4th memory state of the 8 memory states (i.e., the fourth memory state LV3 has been verified) is completed, make the main latch DS store the identifiers corresponding to the 1st to 4th memory states being different from the identifiers corresponding to the 5th to 8th memory states. That is, the identifier of the memory state that has been programmed and verified in the main latch is different from the identifier of the memory state that has not been programmed and verified. When DS is 1, it means that the memory state has passed the programming verification, and when DS is 0, it means that the memory state has failed the programming verification. LV3 programming verification pass (LV3 pass) means that in the three page latches, the segments corresponding to the memory states LV0-LV3 are written in. Among them, all binary codes in LV0 to LV3 can be updated to 1. The encoding state table is shown in FIG. 8. At this time, there are still four memory states LV4, LV5, LV6, and LV7 that are not programmed and verified. Since a bit of each logical page has two possible states, 0 and 1, the physical unit composed of two page latches has four possible states ($2^2$=4). Since the identifier of the memory state that has not passed the program verification in the main latch DS for non-target verification is 0, the combination of the two page latches and the main latch DS for non-target verification may have code 000, code 001, code 010, and code 011 representing LV4, LV5, LV6, and LV7, respectively. In other words, after the LV3 programming verification is passed, only two page latches and the main latch DS for non-target verification are required to distinguish the four memory states of LV4, LV5, LV6, and LV7. Therefore, after the LV3 programming verification is passed, the page latch DC can be released, so that the released page latch caches the programming data of the lower page LP of the second physical page. The encoding state table is shown in FIG. 8.

In some implementations, each page buffer further includes a bias latch configured to store voltage bias information for the corresponding bit line.

In some implementations, the peripheral circuit is further configured to, after making the identifiers corresponding to the 1st to $2^{(N-M)}$th memory states stored in the main latch different from those corresponding to the $2^{(N-M)}+1$st to $2^N$th memory states, float the bit line during programming to dump the first non-physical page information in the main latch. In some implementations, the first non-physical page information includes verification information and programming information. After the LV3 programming verification is passed, the main latch DS is used to identify the memory state that has passed the programming verification and the memory state that has not passed the programming verification. Therefore, the first non-physical page information in the original main latch DS cannot be stored anymore. Floating the bit line during programming can free the bias latch to dump the first non-physical page information in the main latch.

In some implementations, after the LV5 programming verification is passed, it means that the segments corresponding to the memory states LV0-LV5 in the three page latches have been written in, and there are still two memory states LV6 and LV7 that are not passed the verification. Since a bit of each logical page has two possible states, 0 and 1, at this time, the main latch DS and page latch D2 can form code 00 and code 01, which represent the memory states LV6 and LV7 that have not passed the programming verification respectively. Therefore, after the LV5 programming verification is passed, the page latch D1 can be released, so that the released page latch buffers the middle page MP of the next physical page. The encoding state table is shown in FIG. 9.

In some implementations, the peripheral circuit is further configured to: release the N page latches after program verification is performed on the penultimate (second-to-last) memory state in the $2^N$ memory states, so that the N page latches cache the program data for each of the N logical pages of the second physical page. In some implementations, after program verifying the penultimate of the 8 memory states, (i.e., the 7th memory state (LV6) has been verified), release three page latches, so that the three page latches cache the programming data of each of the three logical pages of the second physical page (next LP, next MP, next UP). As shown in FIG. 10, when the programming verification of LV6 is passed, that is, DS is 1, the page latch D2 can be released to cache the programming data of the middle page MP of the second physical page. Thus, the page latch DC is further released to cache the program data of the upper page UP of the second physical page. At this time, three page latches are released to store all the programming data of each page in the three logical pages of the second physical page. At this time, the page latch D1 caches the program data of the lower page LP of the second physical page, the page latch D2 caches the program data of the middle page MP of the second physical page, and the page latch DC caches the program data of the high page UP of the second physical page. And then, whether DS is 1 can be used to determine whether LV7 has passed the programming verification. If DS is 1, it means that the LV7 programming verification has passed, and the data of LV0-LV7 has been written to the selected memory cell, and the first programming is over. At this time, the programming data of the three logical pages to be written by the second programming has been cached in the three page latches. As such, it can directly enter the second programming process. If DS is 0, it fails to continue to perform programming verification. Since the three page latches can cache the program data of each of the three logical pages (next LP, next MP, and next UP) of the second physical page after program verification at LV6, during the first programming operation, the second physical page may become ready. Therefore, at the end of the first programming operation, the second programming operation based on the second physical page can be seamlessly triggered without a data loading window.

Based on the non-volatile memory device provided by the above embodiments of the present application, a programming method for a non-volatile memory device is also provided in the embodiments of the present application. The non-volatile memory device includes a memory cell array and peripheral circuits; the memory cells in the memory cell array are arranged in rows and columns, and each memory cell is set to one of $2^N$ levels corresponding to a piece of N-bits data, where N is an integer greater than 1. The peripheral circuit includes a plurality of page buffers respectively coupled to bit lines. The method includes storing N logical pages of the first physical page corresponding to the current first programming in N page latches. The N page latches include (N−1) data latches in the page buffer and one cache latch coupled to the data path. In the process of first programming the first physical page, when the programming operations of the 1st to $2^{(N-M)}$th memory states are completed, a program verification operation is performed on the programming operation corresponding to the $2^{(N-M)}$th memory state. When the program verification of the $2^{(N-M)}$th memory state is passed, make the identifiers corresponding to the 1st to $2^{(N-M)}$th memory states stored in the main latch different from those corresponding to the $2^{(N-M)}+1$st to $2^N$th memory state, and release at least one of the N page latches to cache program data of at least one logical page of the N logical pages of the second physical page, where M is an integer greater than or equal to 1 and less than or equal to (N−2). And before the second programming of the second physical page in the cache programming mode subsequent to the first programming, and in the process of programming the first physical page for the first time, the program data of one logical page of the N logical pages of the second physical page is stored in a released page latch.

Figure 11:
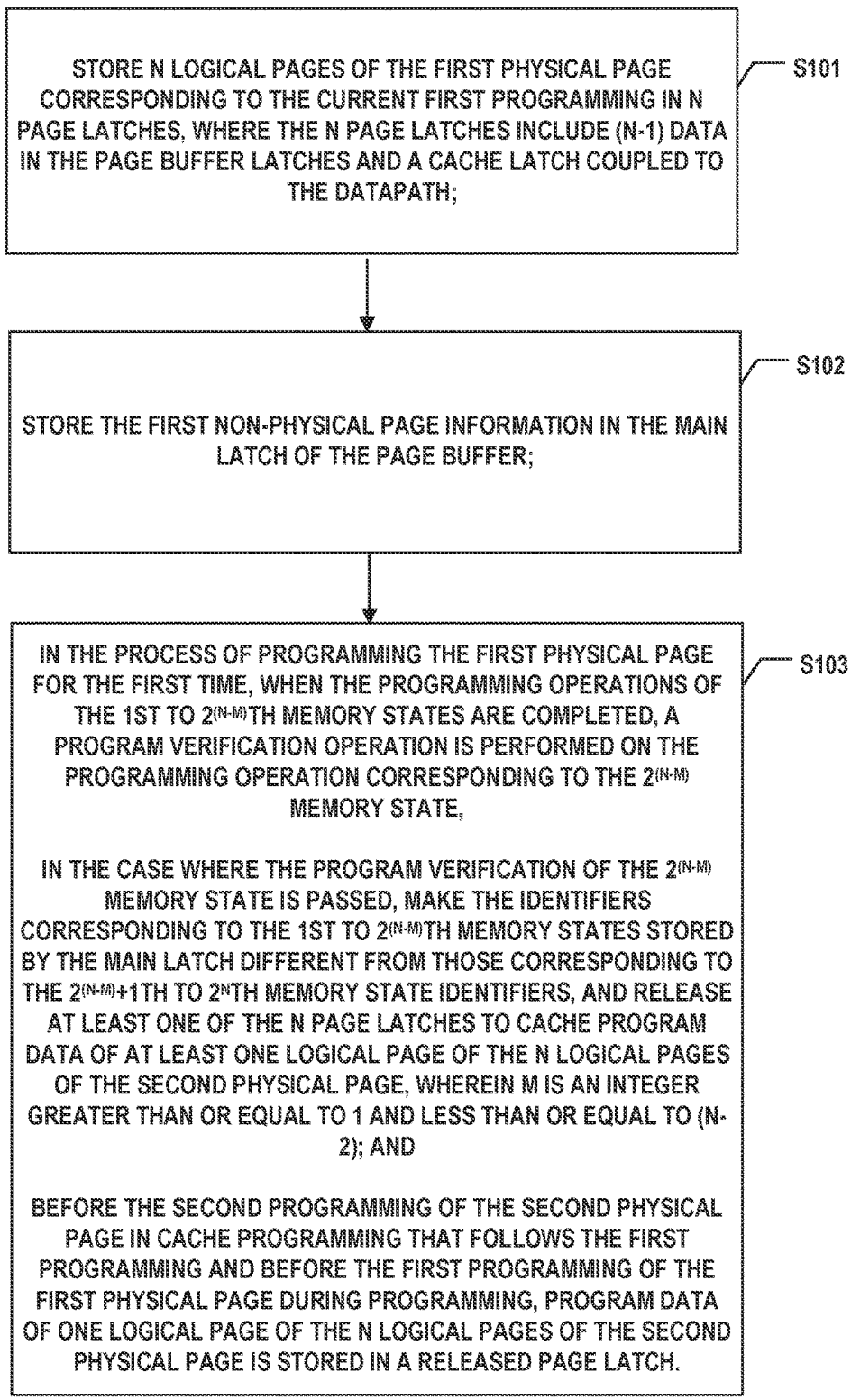
FIG. 11 is a schematic flowchart of a programming method for a non-volatile memory device according to some implementations of the present disclosure.

FIG. 11 is a schematic flowchart of an implementation of a programming method for a non-volatile memory device provided by some implementations of the present application. As shown in FIG. 11, the programming method includes the following steps:

Step S101: Store the N logical pages of the first physical page corresponding to the current first programming in the N page latches, wherein the N page latches include (N−1) data latches in the page buffer and one cache latch coupled to a data path.

After storing the programming data of the three logical pages LP, MP, and UP in the page latches, perform coding conversion on the programming data stored in the page latches according to preset rules to obtain binary codes corresponding to different memory states. This can be referred to FIG. 7.

Step S102: Store the first non-physical page information in the main latch of the page buffer. Here, the first non-physical page information includes verification information and programming information.

In step S101, each memory cell is set to one of $2^3$ levels corresponding to a piece of three-bits data in one memory state among 8 memory states. Before program verification is performed on the 4th memory state of the 8 memory states, program data of a corresponding one of the three logical pages of the first physical page is stored in at least one of three of the page latches. In some implementations, before program verification is performed on the fourth memory state LV3 of the 8 memory states, DC can store the programming data of one of the three logical pages (current UP) of the first physical page corresponding to the current first programming. And D1 can store the programming data of the corresponding logical page (current LP) of the first physical page. And D2 can store the programming data of the corresponding logical page (current MP) of the first physical page. And after program verification of the 4th memory state of the 8 memory states, store program data of one logical page of the three logical pages of the second physical page in at least one of the three page latches. In some implementations, referring to FIG. 8, after program verification of the 4th memory state LV3 of the 8 memory states, store the program data of one of the three logical pages of the second physical page in at least one of the three page latches.

Step S103: In the process of first programming of the first physical page, when the programming operations of the 1st to $2^{(N-M)}$th memory states are completed, perform the programming verification operation corresponding to the $2^{(N-M)}$th memory state.

In the case where the program verification of the $2^{(N-M)}$th memory state passes, make the identifiers corresponding to the 1st to $2^{(N-M)}$th memory states stored by the main latch different from the identifiers corresponding to the $2^{(N-M)}+1$st to $2^N$th memory states, and release at least one of the N page latches to cache program data of at least one logical page of the N logical pages of the second physical page, where M is an integer greater than or equal to 1 and less than or equal to (N−2).

And before and during the first programming of the first physical page prior to the second programming of the second physical page following the first programming in a cache programming manner, store the program data of one logical page among the N logical pages of the second physical page in the released one page latch.

In the above step S103, taking TLC as an example, N=3, M=1, the first programming/second programming is performed on the first physical page/second physical page, including using incremental step pulses programming (ISPP) method to perform programming operations on the 1st to 4th memory states.

In some implementations of the present application, before program verification is performed on the $2^{N-1}$th memory state in the $2^N$ memory states, the program data of a corresponding one logical page of the N logical pages of the first physical page is stored in at least one of the N page latches. And after program verification is performed on the $2^{N-1}$th memory state in the $2^N$ memory states, store program data of one logical page of the N logical pages of the second physical page in at least one of the N page latches. In some implementations, before program verification is performed on the 4th memory state LV3 of the eight memory states, the DC can store the programming data of one logical page (current UP) of the three logical pages of the first physical page. And D1 may store program data of the corresponding logical page (current LP) of the first physical page, and D2 may store program data of the corresponding logical page (current MP) of the first physical page. After program verification of the 4th memory state LV3 of the 8 memory states, the program data of one logical page of the three logical pages of the second physical page is stored in the three page latches. It can be referred to FIG. 8 for details.

In some implementations of the present application, after program verification is performed on the $2^{N-1}$th memory state in the $2^N$ memory states, it causes the main latch DS to perform non-target verification. That is, the identifiers corresponding to the 1st to $2^{(N-1)}$th memory states stored by the main latch DS are different from the identifiers corresponding to the $2^{(N-1)}+1$st to $2^N$th memory states. Specifically, as shown in FIG. 8, after program verification of the 4th memory state of the 8 memory states (i.e., the 4th memory state LV3 has been verified), the identifiers corresponding to the 1st to 4th memory states stored by the main latch DS are different from the identifiers corresponding to the 5th to 8th memory states. That is, the identifiers of the memory state that has been programmed and verified in the main latch are different from the identifiers of the memory state that are not passed the program verification. When DS is 1, it means that the program verification of the memory state has passed, and when DS is 0, it means that the program verification of the memory state has not passed. LV3 programming verification pass (LV3 pass) means that in the three page latches, the segments corresponding to the memory states LV0-LV3 are written in. That is, all binary codes in LV0 to LV3 can be updated to 1. The encoding state table is shown in FIG. 8. At this time, there are still four memory states LV4, LV5, LV6, and LV7 that are not programmed and verified. Since a bit of each logical page has two possible states of 0 and 1, the physical unit composed of two page latches has four possible states ($2^2$=4). Since the identifier of the memory state that has not passed the program verification in the main latch DS for non-target verification is 0, the combination of the two page latches and the main latch DS for non-target verification can have the code 000, 001, 010, and 011 representing LV4, LV5, LV6, and LV7, respectively. In other words, after the LV3 programming verification is passed, only two page latches and the main latch DS for non-target verification are needed to distinguish the four memory states of LV4, LV5, LV6, and LV7. Therefore, after the LV3 programming verification is passed, the page latch DC can be released, so that the released page latch caches the programming data of the lower page LP of the second physical page. The encoding state table is shown in FIG. 8.

In some implementations of the present application, in the case that the program verification of the $2^{(N-M)}$th memory state is passed, the identifiers corresponding to the 1st to $2^{(N-M)}$th memory states stored by the main latch are made different from the identifiers corresponding to the $2^{(N-M)}+1$st to $2^N$th memory states, includes: after performing program verification on the $2^{N-1}$th memory state in the $2^N$th memory states, causing the main latch to perform non-target verification. The non-target verification makes the identifiers corresponding to the 1st to $2^{N-1}$th memory states stored by the main latch different from the identifiers corresponding to the $2^{(N-1)}+1$th to $2^N$th memory states. Specifically, referring to FIG. 8, after program verification of the 4th memory state of the 8 memory states (i.e., the 4th memory state LV3 has been verified), causing main latch DS performing non-target verification. The non-target verification makes the identifiers corresponding to the 1st to 4th memory states stored in the main latch different from the identifiers corresponding to the 5th to 8th memory states. When DS is 1, it indicates that the memory state has passed the program verification, and when DS is 0, it means that the memory state has not pass the program verification.

In some implementations of the present application, after the main latch performs non-target verification, the bit line is floated during programming to dump the first non-physical page information in the main latch. Due to the non-target verification after LV3 program verification is passed, the main latch is used to identify the memory state that has been programmed and verified and the memory state that has not been programmed and verified. Therefore, it cannot continue to store the first non-physical page information in the original main latch DS. After the non-target verification of the main latch, floating the bit line during programming can free the bias latch to dump the first non-physical page information in the main latch.

In some implementations of the present application, after program verifying the penultimate of the $2^N$ memory states, release N of the page latches so that the N said page latches cache program data for each of the N logical pages of the second physical page. In some implementations, after program verifying the penultimate of the 8 memory states (i.e., the 7th memory state (LV6) has been verified), three of the page latches are released so that the three of the page latches cache program data for each of the three logical pages of the second physical page (Next LP, Next MP, Next UP). As shown in FIG. 10, when the programming verification of LV6 is passed, that is, DS is 1, the page latch D2 can be released to cache the programming data of the middle page MP of the second physical page, thereby further releasing the page latch DC to cache the programming data of the upper page UP of the second physical page. At this time, three page latches are released to store all the programming data of each page in the three logical pages of the second physical page. At this time, the page latch D1 caches the program data of the lower page LP of the second physical page, the page latch D2 caches the program data of the middle page MP of the second physical page, and the page latch DC caches the program data of the high page UP of the second physical page. And after that, whether DS is 1 can be used to determine whether LV7 has passed the programming verification, if DS is 1, it means that the LV7 programming verification has passed, and the data of LV0-LV7 has been written into the selected memory cell. The programming is over. At this time, the programming data of the three logical pages to be written in the second programming process are already in the page latch, and the second programming process can be directly entered. If DS is 0, it fails to continue to perform program verification determination.

In some implementations of the present application, after the peripheral circuit included in the nonvolatile memory device stores the programming data of three logical pages in the three page latches, a coding conversion is performed on the programming data of the logical page stored in the page latch according to preset rules. As shown in FIG. 12, the encoding state table converted by the encoding in FIG. 6 is obtained, and each memory state before the encoding conversion includes three-bit binary codes, which come from LP/MP/UP, respectively. After encoding conversion, LV1 is encoded from 011 to 001, where 011 comes from LP/MP/UP in sequence. Similarly, the encoding order of other memory states is LP/MP/UP, LV2 is encoded from 001 to 101, LV3 is encoded from 000 to 011, LV4 is encoded from 010 to 110, LV5 is encoded from 110 to 000, LV6 is encoded from 100 to 100, and LV7 is encoded from 101 to 010. In some implementations, DC may store program data of one (current UP) of the three logical pages of the first physical page, D1 may store program data of the corresponding logical page (current LP) of the first physical page, and D2 may store program data of the corresponding logical page (current MP) of the first physical page. LV4 programming verification pass (LV4 pass) means that the segments corresponding to the memory states LV0-LV4 in the three page latches are written in. That is, all binary codes in LV0 to LV4 can be updated to 1, since they are no longer needed in the first programming operation. The coding state table is shown as in FIG. 13. At this time, there are still three memory states LV5, LV6, and LV7 remaining unprogrammed and verified. Since a bit of each logical page has two possible states of 0 and 1, the physical unit includes two page latches and has four possible states ($2^2=4$). Excluding code 11 that is the same as the memory state that has been programmed and verified, the remaining code 00, code 10, and code 01 can represent LV5, LV6, and LV7, respectively.

In other words, after the LV4 programming verification is passed, only two page latches are needed to distinguish the three memory states of LV5, LV6, and LV7. Therefore, the page latch DC can be released after the LV4 programming verification is passed. The program data of the current upper page UP is replaced with the program data of the lower page LP of the second physical page.

In some implementations of the present application, the peripheral circuit is further configured to: after program verification is performed on the third-to-last memory state in the $2^N$ memory states, the main latch is subjected to the non-target verification, so that the non-target verification makes the identifiers corresponding to the 1st to $2^{N-2}$nd memory states stored by the main latch to be different from the identifiers corresponding to the $2^{N-1}$st to $2^N$th memory states. In some implementations, after program verification of the antepenultimate (third-to-last) memory state of the 8th memory states (i.e., the sixth memory state (LV5) has been verified), the main latch DS performs non-target verification that the identifiers corresponding to the 1st to 6th memory states stored in the main latch are different from the identifiers corresponding to the 7th to 8th memory states. When DS is 1, it means that the memory state programming verification is passed; when DS is 0, it means that the memory state programming verification is not passed. The binary encode of FIG. 13 can be updated, as shown in FIG. 14. That is, all data bits in LV5 can be updated to 1, because they are no longer needed in the current first programming operation. As shown in FIG. 14, DS is 1 at this time, indicating that the LV5 programming verification is passed. At this time, the main latch DS and the page latch D2 can form code 00 and code 01, which can represent LV6 and LV7, respectively. In other words, after the LV5 programming verification is passed, only one page latch and the main latch DS for non-target verification are needed to distinguish the two memory states of LV6 and LV7. Therefore, after the LV5 program verification is passed, the page latch D1 can be released to cache the programming data of the lower page LP of the second physical page, thereby further releasing the page latch DC to cache the programming data of the middle page MP of the second physical page. That is, the next LP can be passed from DC to D1, and the programming data of the next MP can be cached in the DC. It should be noted that when the main latch DS is performing target verification, the state bit of the program verification being performed is 1, and the other state bits are 0.

Because the non-target verification performed after the LV5 verification is passed makes the identifiers corresponding to the 1st to 6th memory states stored in the main latch different from the identifiers corresponding to the 7th to 8th memory states, the first non-physical page information in the original main latch DS cannot be stored anymore. After a non-target verification of the main latch DS, the bit line is floated during programming to free the bias latch DL to dump the first non-physical page information in the main latch DS.

In some implementations of the present application, the peripheral circuit is further configured to after program verification is performed on the penultimate memory state in the $2^N$ memory states, release the N page latches, so that N The page latches cache program data for each of the N logical pages of the second physical page. In some implementations, after program verification of the penultimate memory state of the 8 memory states (i.e., the 7th memory state (LV6) has been verified), release three of the page latches, so that the three said page latches cache the programming data for each of the three logical pages of the second physical page (next LP, next MP, next UP). As shown in FIG. 15, when the programming verification of LV6 is passed, and DS is 1, the page latch D2 can be released to cache the programming data of the middle page MP of the second physical page. Thus, the page latch DC is further released to cache the program data of the upper page UP of the second physical page. At this time, three page latches are released to store all the programming data of each page in the three logical pages of the second physical page. At this time, the page latch D1 caches the programming data of the lower page LP of the second physical page, the page latch D2 caches the program data of the middle page MP of the second physical page, and the page latch DC caches the program data of the upper page UP of the second physical page. And after that, whether DS is 1 can be used to determine whether LV7 has passed the programming verification; if DS is 1, it means that the LV7 programming verification has passed, and the data of LV0-LV7 has been written into the selected memory cell, and the first programming is over. At this time, the programming data of the three logical pages to be written in the second programming have been cached in the three page latches, and the second programming process can be directly entered. If DS is 0, it fails to continue to perform programming verification determination. Since the three page latches can cache the programming data of each of the three logical pages (next LP, next MP, and next UP) of the second physical page after program verification at LV6, during the first programming operation, the second physical page may become ready. Therefore, at the end of the first programming operation, the second programming operation based on the second physical page can be seamlessly triggered without a data loading window.

Based on the non-volatile memory device according to some implementations of the present application, a programming method for a non-volatile memory device is provided. The programming method includes the following steps.

Step S201: Store N logical pages of the first physical page corresponding to the current first programming in the N page latches. The N page latches include (N−1) data latches in the page buffer and one cache latch coupled to a data path.

After the programming data of the three logical pages of LP, MP and UP are stored in the page latch, the programming data stored in the page latch is encoded and converted according to preset rules to obtain binary data corresponding to different memory states. It is shown in FIG. 12 for more details.

Step S202: Store the first non-physical page information in the main latch of the page buffer. Here, the first non-physical page information includes verification information and programming information.

Step S203: in the process of programming the first physical page for the first time, when the programming operations of the 1st to $2^{(N-M)}$th memory states are completed, perform the programming verification corresponding to the $2^{(N-M)}$th memory state. If the programming verification of the $2^{(N-M)}$th memory state is passed, the identifiers corresponding to the 1st to $2^{(N-M)}$th memory states stored by the main latch are made different from those corresponding to the $2^{(N-M)}+$1st to the identification of the $2^N$th memory state, thereby releasing at least one of the N page latches to cache program data of at least one logical page of the N logical pages of the second physical page, where M is an integer greater than or equal to 1 and less than or equal to (N−2); and prior to and during the first programming of the first physical page in cache programming of the second physical page following the second programming of the first programming, the program data of one logical page among the N logical pages of the second physical page is stored in the released one page latch.

In the above step S203, taking TLC as an example, N=3, M=1, perform first programming/second programming on the first physical page/second physical page, including programming the 1st to $2^2$nd memory states using the incremental step pulse programming ISPP programming method.

In some implementations, in the case that the program verification of the $2^{(N-M)}$th memory state is passed, the identifiers corresponding to the 1st to $2^{(N-M)}$th memory states stored in the main latch are made different from the identifiers corresponding to the $2^{(N-M)}+$1st to $2^N$th memory states, including:

After program verification of the third-to-last memory state of the $2^N$ memory states, the main latch performs the non-target verification. The non-target verification makes the identifiers corresponding to the 1st to $2^{N-2}$nd memory states stored by the main latch to be different from the identifiers corresponding to the $2^{N-1}$st to $2^N$th memory states. Specifically, referring to FIG. 14, after program verification of the third-to-last memory state of the 8 memory states (i.e., the third-to-last memory state LV5 has been verified), the main latch DS performs the non-target verification, and the non-target verification makes the identifiers corresponding to the 1st to 6th memory states stored by the main latch to be different from the identifiers corresponding to the 7th to 8th memory states. When DS is 1, it means that the program verification of the memory state has passed, and when DS is 0, it means that the program verification of the memory state has not passed.

In some implementations, after the main latch performs the non-target verification, the bit line is floated during programming to dump the first non-physical page information in the main latch. Due to the non-target verification performed after the LV3 programming verification has passed, the main latch is used to identify the memory state that has passed the programming verification and the memory state that has not passed the programming verification. Therefore, the first non-physical page information in the original main latch DS cannot be stored anymore. After the non-target verification of the main latch DS, the bit line is floated during programming to free the bias latch DL to dump the first non-physical page information in the main latch DS.

In some implementations of the present application, after program verification is performed on the penultimate memory state in the $2^N$ memory states, release N of the page latches so that the N said page latches cache program data for each of the N logical pages of the second physical page.

In some implementations, after program verifying the penultimate of the 8 memory states (i.e., the 7th memory state (LV6) has been verified), release three of the page latches to cause the three page latches to cache program data for each of the three logical pages of the second physical page (next LP, next MP, next UP). As shown in FIG. 15, when the programming verification of LV6 is passed, that is, DS is 1, and the page latch D2 can be released to cache the programming data of the middle page MP of the second physical page. Thus, the page latch DC is further released to cache the program data of the upper page UP of the second physical page. At this time, three page latches are released to store all the programming data of each page in the three logical pages of the second physical page. At this time, the page latch D1 caches the programming data of the lower page LP of the second physical page, the page latch D2 caches the program data of the middle page MP of the second physical page, and the page latch DC caches the program data of the upper page UP of the second physical page. And after that, whether DS is 1 can be used to determine whether LV7 has passed the programming verification; if DS is 1, it means that the LV7 programming verification has passed, and the data of LV0-LV7 has been written into the selected memory cell, and the first programming is over. At this time, the programming data of the three logical pages to be written in the second programming have been cached in the three page latches, and the second programming process can be directly entered. If DS is 0, it fails to continue to perform programming verification determination.

In some implementations, it further provides a non-volatile memory device, the non-volatile memory device includes a memory cell array and a peripheral circuit. The memory cells in the memory cell array are arranged in rows and columns. Each memory cell is set to one of $2^N$ levels corresponding to a piece of N−bits data, for example, four-bit data. The peripheral circuit is coupled to the memory cell array. The peripheral circuit is configured to perform first programming and second programming sequentially and respectively on the memory cell array on the first physical page and the second physical page in a cache programming manner and program the selected row of memory cells based on four logical pages of the first physical page/second physical page during the first programming/second programming. The four logical pages are, respectively, a Lower Page (LP), a Middle Page (MP), a Upper Page (UP), and an Extra Page (XP).

The peripheral circuit includes a plurality of page buffers respectively coupled to bit lines. Each page buffer includes a main latch DS, three data latches D1, D2, D3, and a buffer coupled to the data path latch DC. The main latch DS is configured to be able to store the first non-physical page information; the three data latches D1, D2, D3, and the one cache latch DC are used for the four logical pages of the first physical page/the second physical page are used as four page latches to temporarily store the programming data to be written into the four logical pages in the process of performing one programming. The peripheral circuit is also configured to: in the process of programming the first physical page, when the programming operations of the 1st to $2^{(N-M)}$th memory states are completed, a program verification operation is performed on the programming operation corresponding to the $2^{(N-M)}$th memory state. In the case where the program verification of the $2^{(N-M)}$th memory state is passed, the identifiers corresponding to the 1st to $2^{(N-M)}$th memory states stored by the main latch are different from those corresponding to the $2^{(N-M)}$–1st to $2^N$th memory states, and at least one of the four page latches to cache program data of at least one logical page of the four logical pages of the second physical page are released. And in the process of programming the first physical page, the programming data of one logical page among the four logical pages of the second physical page is stored in a released page latch.

In some implementations, each memory cell has 16 memory states (levels) and thus, is set to one of $2^4$ levels corresponding to a piece of four bits data. Each memory state may correspond to one of 24 threshold voltage (Vth) ranges for the memory cell. On the other hand, each memory state may correspond to one of $2^4$ pieces of four-bit data to be stored in the selected row of memory cells. In some implementations, coding conversion is performed on the programming data of the logical page stored in the page latch according to a preset rule to obtain codes corresponding to different memory states. Specifically, referring to FIG. 16, an example of binary encoding of one-to-one mapping between 16 memory states (LV0 to LV15) and 16 segments after encode conversion is shown. Each segment of four-bit data may include four-bit binary codes. The four-bit binary codes are respectively derived from four logical pages. The four logical pages are low page LP, middle page MP, high page UP, and extra Page XP, respectively. It can be seen that the four page latches store the programming data of the four logical pages in sequence, page latch D1 stores the low page LP, page latch D2 stores the middle page MP, page latch D3 stores the high page UP, the page latch DC stores the extra page XP. After encoding conversion, as shown in FIG. 16, the code of LV1 is 0001, where 0001 comes from LP/MP/UP/XP in order, respectively. Similarly, the coding order of other memory state bits is LP/MP/UP/XP, the coding of LV2 is 1001, and so on, the coding of LV7 is 1011, the coding of LV8 is 0000, and the coding of LV15 is 1110.

In some implementations of the present application, the peripheral circuit is configured to before program verification is performed on the $2^{N-1}$th memory state of the $2^N$ memory states, store program data of a corresponding one of the N logical pages of the first physical page in at least one of the N page latches; and after program verification is performed on the $2^{N-1}$th memory state in the $2^N$ memory states, program data for one logical page of the N logical pages of the second physical page is stored in at least one of the N number of the page latches.

In some implementations, the DC may store programming data for one logical page (current XP) of the four logical pages of the first physical page before program verification is performed on the 8th memory state LV7 of the 16 memory states. D1 may store program data of the corresponding logical page (current LP) of the first physical page, D2 may store program data of the corresponding logical page (current MP) of the first physical page, and D3 may store program data of the corresponding logical page (currently UP) of the first physical page. And after program verification of the 8th memory state LV7 of the 16 memory states, store program data of one logical page in the four logical pages of the second physical page in the four page latches. It can be referred to FIG. 17 for details.

In some implementations of the present application, the peripheral circuit is further configured to after program verification of the $2^{N-1}$th memory state of the $2^N$ memory states, make the main latch DS to perform the non-target verification. That is, the identifiers corresponding to the 1st to $2^{(N-1)}$th memory states stored by the main latch DS are made different from the identifiers corresponding to the $2^{(N-1)}$+1st to $2^N$th memory states. Specifically, referring to FIG. 17, after program verification of the 8th memory state of the 16 memory states (i.e., the 8th memory state LV7 has been verified), the identifiers corresponding to the 1st to 8th memory states stored by the main latch DS are different from the identifiers corresponding to the 9th to 16th memory states. That is, the identifiers of the memory states that have passed the program verification in the main latch are different from the identifiers of the memory states that have not passed the program verification. When DS is 1, it indicates that the program verification of the memory state has passed, and when DS is 0, it indicates that the program verification of the memory state has not passed.

At this time, the main latch DS and page latches D1, D2 and D3 can form code 0000, code 0001, code 0010, code 0011, code 0100, code 0101, code 0110, and code 0111, which can represent LV8 to LV15, respectively. In other words, after the LV7 programming verification has passed, only three page latches and the main latch DS for non-target verification are needed to distinguish the eight memory states from LV8 to LV15. Therefore, after the LV7 program verification is passed, the page latch DC can be released to cache the program data of the lower page LP of the second physical page. The encoding state table is shown in FIG. 17. At this time, when DS is 1, it indicates that the LV7 program verification has passed, and the page latch DC can be released to cache the program data of the lower page LP of the second physical page.

Since the non-target verification after the LV7 programming verification is passed, the main latch is used to identify the memory state that has passed the programming verification and the memory state that has not passed the programming verification. Therefore, the first non-physical page information in the original main latch DS cannot be stored anymore. After the non-targeted verification of the main latch DS, the bit line is floated during programming to make the bias latch idle, thereby dumping the first non-physical page information in the main latch DS.

In some implementations of the present application, passing the LV11 programming verification means that the segments corresponding to the memory states LV0 to LV11 in the four page latches are all written in. At this time, there are still four memory states LV12, LV13, LV14, and LV15, remaining unprogrammed and unverified.

Since a bit of each logical page has two possible states, 0 and 1, the two page latches have four possible states ($2^2=4$). In the non-target verification, the state bits of DS that are not programmed and verified are all 0, and the state bits of DS are only 1 when the program verification of the state bit has passed.

At this time, the main latch DS and the page latches D2 and D3 can form code 000, code 001, code 010, and code 011, which can represent LV12 to LV15, respectively. In other words, after the LV11 programming verification has passed, only two page latches and the main latch DS for non-target verification are needed to distinguish the four memory states from LV12 to LV15. Therefore, after the LV11 programming verification is passed, the page latch D1 can be released to cache the programming data of the lower page LP of the second physical page. Thus, the page latch DC is further released to cache the program data of the middle page MP of the second physical page, and the encoding state table is shown in FIG. 18.

Similarly, after the LV13 programming verification has passed, there are still two memory states LV14 and LV15 left that have not passed the program verification. In the non-target verification process, the state bits of DS that are not programmed and verified are all 0, and the state bits of DS are 1 when the program verification has passed. At this time, the main latch DS and the page latch D3 can form code 00 and code 01, which can represent LV14 and LV15, respectively. In other words, after the LV13 programming verification is passed, only one page latch D3 and the main latch DS for non-target verification are needed to distinguish the two memory states of LV14 and LV15. Therefore, after the LV13 programming verification is passed, the page latch D2 can be released to cache the programming data of the middle page MP of the second physical page. Thus, the page latch DC is further released to cache the programming data of the upper page UP of the second physical page, and the encoding state table is shown in FIG. 19.

In some implementations of the present application, the peripheral logic circuit is further configured to: after program verification of the penultimate memory state of the $2^N$ memory states, the N page latches are released so that the N page latches cache N of the second physical page Program data for each page in the logical page.

In some implementations, after program verifying the penultimate of the 16 memory states (i.e., the 15th memory state (LV14) has been verified), 4 of the 10 page latches are released so that the four of the page latches cache the programming data of each of the four logical pages of the second physical page (next LP, next MP, next UP, next XP).

As shown in FIG. 20, when the programming verification of LV14 is passed, that is, DS is 1, then the page latch D3 can be released to cache the programming data of the upper page UP of the second physical page. As such, the page latch DC is further released to cache the program data of the upper page XP of the second physical page. At this time, four page latches are released to store all the programming data of each page in the four logical pages of the second physical page. At this time, the page latch D1 caches the programming data of the lower page LP of the second physical page, the page latch D2 caches the program data of the middle page MP of the second physical page, the page latch D3 caches the programming data of the upper page UP of the second physical page, and the page latch DC caches the programming data of the extra page XP of the second physical page.

And after that, whether the DS is 1 can be used to determine whether the LV15 has passed the programming verification. If DS is 1, it means that the LV15 programming verification has passed, the data of LV0-LV15 has been written into the memory cell array, and the first programming is over. At this time, the programming data of the four logical pages to be written in the second programming have been cached in the four page latches, and the second programming process can be directly entered. If DS is 0, it fails to continue to perform programming verification determination.

In some implementations of the present application, after the peripheral circuit included in the nonvolatile memory device stores the programming data of four logical pages in the four page latches, the programming data of the logical page in the code is converted according to the preset rules, and the code state table after the code conversion as shown in FIG. 21 is obtained. As shown in FIG. 21, the data encoding of LV1 is 0001, where 0001 comes from LP/MP/UP/XP in sequence, respectively. Similarly, the encoding order of other memory states is LP/MP/UP/XP, the encoding of LV2 is 1001, and so on, the encoding of LV8 is 1110, and the encoding of LV15 is 1100.

In some implementations, the DC may store program data for one (current XP) of the four logical pages of the first physical page before program verification is performed on LV8 in the 16 memory states, D1 can store the programming data of the corresponding logical page (current LP) of the first physical page, D2 can store the programming data of the corresponding logical page (current MP) of the first physical page, and D3 can store the programming data of the corresponding logical page (current UP) of the first physical page. LV8 programming verification pass (LV8 pass) means that the segments corresponding to the memory states LV0-LV8 in the four page latches are all written in. At this time, there are still 7 memory states LV9, LV10, LV11 to LV15, unprogrammed and unverified. Since a bit of each logical page has two possible states, 0 and 1, the three page latches have 8 possible states ($2^3=8$). Excluding code 111 that is the same as the memory state that has been programmed and verified, there are still 7 codes that can represent LV9, LV10, LV11 to LV15, respectively. In other words, only three page latches are needed to distinguish the seven memory states of LV9, LV10, LV11 to LV15 after the LV8 programming verification is passed. Therefore, after the LV8 programming verification is passed, the page latch DC can be released to store the programming data of the lower page LP of the second physical page in the released page latch. The encoding state table is shown in FIG. 22.

Similarly, after the LV12 programming verification is passed, there are still three memory states LV13, LV14, and LV15 unprogrammed and unverified. Since a bit of each logical page has two possible states, 0 and 1. A page latch can have four possible states ($2^2=4$). Excluding code 11 that is the same as the memory state that has been programmed and verified, the remaining three codes of 00, 01, and 10 can represent LV13, LV14, and LV15, respectively.

In other words, after the LV12 programming verification is passed, only two page latches are needed to distinguish the three memory states of LV13, LV14, and LV15. Therefore, after the LV12 programming verification is passed, the page latch D1 can be released, so that the released page latch D1 caches the programming data of the lower page LP of the second physical page. Thus, the page latch DC is further released to cache the program data of the middle page MP of the second physical page, and the encoding state table is shown in FIG. 23.

In some implementations of the present application, the peripheral circuit is further configured to: after program verification is performed on the third-to-last memory state in the 16 memory states, the main latch performs non-target verification. The non-target verification makes the identifiers corresponding to the 1st to $2^{N-2}$nd memory states stored by the main latch to be different from the identifiers corresponding to the $2^{N-1}$st to $2^N$th memory states. In some implementations, after program verification of the third-to-last memory state of the 16 memory states (i.e., the 14th memory state (LV13) has been verified), the main latch DS performs a non-target verification. The non-target verification makes the identifiers corresponding to the 1st to 14th memory states stored in the main latch to be different from the identifiers corresponding to the 15th to 16th memory states. When DS is 1, it means that the program verification of the memory state has passed, and when DS is 0, it means that the program verification of the memory state has not passed. The binary encoding shown in FIG. 23 can be updated as shown in FIG. 24, where all data bits in LV13 can be updated to 1, since they are no longer needed in the current first programming operation. As shown in FIG. 24, at this time, the main latch DS and the page latch D3 can form code 01 and code 00, which can represent LV14 and LV15, respectively. In other words, only one page latch D3 and one main latch DS for performing the non-target verification can distinguish the two memory states of LV14 and LV15. Therefore, after the LV13 programming verification is passed, the page latch D2 can be released to cache the programming data of the middle page MP of the second physical page. Thus, the page latch DC caches the programming data of the upper page UP of the second physical page. That is, the next MP can be passed from DC to D2, and the programming data of the next UP can be cached in DC.

Due to the non-target verification performed after the LV13 verification passes, the identifiers corresponding to the 1st to 14th memory states stored by the main latch are different from those corresponding to the 15th to 16th memory states. Therefore, the first non-physical page information in the original main latch DS cannot be stored anymore. After the main latch DS performs the non-target verification, the bit line is floated during the programming to free the bias latch DL and to dump the first non-physical page information in the main latch DS.

In some implementations of the present application, the peripheral logic circuit is further configured to: after program verification of the penultimate memory state of the $2^N$ memory states, the N of the page latches are released so that the N of the page latches cache the program data of the N logical pages of the second physical page for each of the pages.

In some implementations, after program verification of the penultimate of the 16 memory states (i.e., the 15th memory state (LV14) has been verified), the four page latches are released so that the four of the page latches cache program data for each of the four logical pages (next LP, next MP, next UP, next XP) of the second physical page.

As shown in FIG. 25, when the programming verification of LV14 is passed and DS is 1, the page latch D3 can be released to cache the programming data of the upper page UP of the second physical page, thereby further releasing the page latch DC to cache the programming data of the extra page XP of the second physical pages. At this time, the four page latches are released to store all the programming data of the four logical pages of the second physical page. At this time, the page latch D1 caches the programming data of the lower page LP of the second physical page, the page latch D2 caches the program data of the middle page MP of the second physical page, the page latch D3 caches the programming data of the upper page UP of the second physical page, and the page latch DC caches the programming data of the extra page XP of the second physical page.

And after that, whether the DS is 1 can be used to determine whether the LV15 has passed the programming verification. If DS is 1, it means that the LV15 programming verification has passed, the data of LV0-LV15 has been written into the selected memory cell, and the first programming is over. At this time, the programming data of the four logical pages to be written in the second programming have been cached in the four page latches, and the second programming process can be directly entered. If DS is 0, it fails to continue to perform programming verification determination.

The present disclosure also provides a non-volatile memory device. The non-volatile memory device includes a memory cell array and a peripheral circuit. The memory cells in the memory cell array are arranged in rows and columns, and each memory cell is set to one of $2^3$ levels corresponding to a piece of three-bits data. The peripheral circuit is configured to perform first programming and second programming, respectively and sequentially, on the memory cell array with the first physical page and the second physical page in a cache programming manner, and program the selected row of memory cells based on three logical pages of the first physical page/second physical page during the first programming/second programming. The three logical pages are respectively a low page LP, a middle page MP, and a high page UP.

The peripheral circuit includes a plurality of page buffers coupled to bit lines, respectively. Each page buffer includes a main latch, a bias latch DL, (N−1) data latches, and one cache latch coupled to the data path. The bias latch is configured to store second non-physical page information. The (N−1) data latches and the one cache latch are used to perform one programming on the N logical pages of the first physical page/second physical page and temporarily store the programming data of the N page latch to be written to N logical pages (for example, for TLC, N=3).

The peripheral circuit is configured to inhibit a bit line bias function from releasing the bias latch to replace one of the N page latches during programming of the first physical page, for program verification of memory states, and to release one of the N page latches to cache program data of one logical page of the N logical pages of the second physical page. And, in the process of programming the first physical page, the programming data of one logical page among the N logical pages of the second physical page is stored in a released page latch. In some implementations, the non-volatile memory device includes a three-dimensional NAND flash memory device.

In some implementations of the present application, the peripheral circuit is further configured to use the ISPP programming method to program the 1st to $2^{(N-M)}$th memory states in the process of programming the first physical page/second physical page.

In some implementations of the present application, the second non-physical page information includes voltage bias information of a corresponding bit line.

In some implementations of the present application, the peripheral circuit is further configured to: before program verification is performed on the $2^{N-1}+1$st memory state of the $2^N$ memory states, program data of a corresponding one of the N logical pages of the first physical page is stored in the at least one of the page latches. In some implementations, before program verification is performed on the 5th memory state LV4 of the 8 memory states, the DC may store program data of one (current UP) of the three logical pages of the first physical page, the D1 may store the program data of the corresponding logical page (current LP) of the first physical page, and the D2 may store program data of the corresponding logical page (current MP) of the second physical page.

After performing the same encoding conversion as in FIG. 12 on the programming data of different logical pages stored in the page latches and after program verification of the $2^{N-1}+1$st memory state of the $2^N$ memory states, one logical page of the N logical pages of the second physical page is stored in the N pages at least one of the latches. That is, after the LV4 programming verification is passed, the page latch DC is released, so that the released page latch caches the programming data of the lower page LP of the second physical page. The encoding state table is shown in FIG. 13.

In some implementations of the present application, the peripheral circuit is further configured to: the bit line bias function is disabled after program verification of the third-to-last memory state of the $2^N$ memory states. In some implementations, the bit line bias function is disabled after program verification of the third-to-last memory state LV5 of the eight memory states. FIG. 26 is an encoding state table after disabling the bit line bias function provided by some implementations of the application. It can be seen that the bias latch DL is idle after disabling the bit line bias function, and it can be used to replace a page latch for programming verification of the memory state. Then, the page latch D1 can be released to cache the programming data of the lower page LP of the second physical page, thereby further releasing the page latch DC to cache the programming data of the middle page MP of the second physical page.

In some implementations of the present application, the peripheral circuit is further configured to after disabling the bit line bias function, decrease the step increment of the programming voltage. Since the bit line bias function itself is used to reduce the width of the distribution of the threshold voltage of the memory cell, after the bit line bias function is disabled, it can be compensated by reducing the step increment of the programming voltage. In this way, a page latch can be replaced by a bias latch without affecting the function of the nonvolatile memory device.

In some implementations of the present application, the main latch DS is configured to store verification information and programming information.

In some implementations of the present application, the peripheral circuit is further configured to after program verification in the penultimate of the $2^N$ memory states, release N of the page latches, so that the data latches cache each of the N logical pages of the next physical page.

In some implementations, after verifying the penultimate memory state of the eight memory states (i.e., the seventh memory state (LV6) has been verified), three of the page latches are released, so that the three page latches cache the program data for each of the three logical pages (next LP, next MP, next UP) of the second physical page. The encoding state table is shown in FIG. 27. After the programming verification of LV6 has passed, there is still one memory state LV7 that has not passed the programming verification. Since a bit of each logical page has two possible states, 0 and 1, a latch has 2 possible states ($2^1=2$). In other words, after the LV6 programming verification is passed, only one bias latch DL is needed to determine whether the LV7 programming verification is passed or not. Therefore, after the program verification of LV6 has passed, the page latch D2 can be released to cache the program data of the middle page MP of the second physical page, thereby further releasing the page latch DC to cache the program data of the upper page UP of the second physical page.

At this time, three page latches are released to store all the programming data of each page in the three logical pages of the second physical page. At this time, the page latch D1 caches the program data of the lower page LP of the second physical page, the page latch D2 caches the program data of the middle page MIP of the second physical page, and the page latch DC caches the program data of the upper page UP of the second physical page.

After that, whether DL is 1 can be used to determine whether LV7 has passed the programming verification. If DL is 1, it means that the LV7 programming verification has passed, which means that the data of LV0-LV7 has been written into the selected memory cell, and the first programming is over. At this time, the program data of the three logical pages to be written in the second programming have been cached in the page latch, and the second programming process can be directly entered. If DL is 0, it does not pass the programming verification.

Based on the non-volatile memory device provided by the above implementations of the present application, it further provides a programming method for a non-volatile memory device. The non-volatile memory device includes a memory cell array and a peripheral circuit. The memory cells in the memory cell array are arranged in rows and columns, each memory cell is set to one of $2^N$ levels corresponding to a piece of N–bits data, and N is an integer greater than 1. The peripheral circuit includes a plurality of page buffers coupled to bit lines, respectively. The method includes storing N logical pages of the first physical page corresponding to the current first programming in N page latches. The N page latches include (N–1) data latches in the page buffer and one cache latch coupled to a data path. Second non-physical page information is stored in a bias latch in the page buffer. During programming of the first physical page, the bit line bias function is disabled to release the bias latch to replace one of the N page latches for memory state programming verification, and one page latch in the N page latches is released. Prior to the second programming of the second physical page subsequent to the first programming in cache programming, and during the first programming of the first physical page, store the program data for one logical page of the N logical pages of the page in the released page latch.

Figure 28:
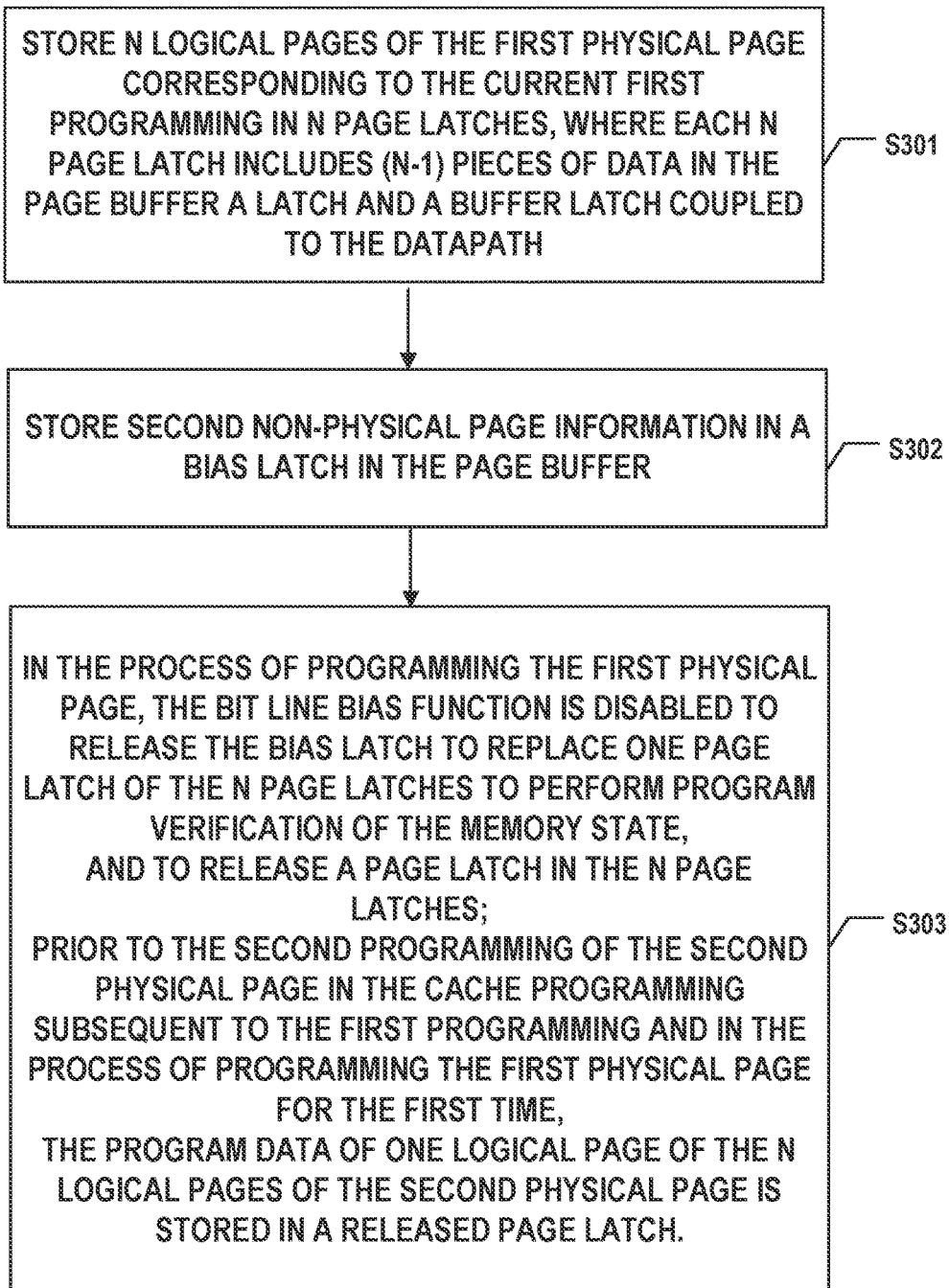
FIG. 28 is a schematic flowchart of a programming method for a non-volatile memory device according to some implementations of the present disclosure.

FIG. 28 is a schematic flowchart of some implementations of a programming method for a non-volatile memory device. As shown in FIG. 28, the programming method includes the following steps:

Step S301: Store N logical pages of the first physical page corresponding to the current first programming in the N page latches. The N page latches include (N–1) data latches in the page buffer and one cache latch coupled to a data path. After storing the programming data of the three logical pages LP, MP, and UP in the page latch, encode conversion is performed on the page data stored in the data latch according to preset rules to obtain binary codes corresponding to different memory states, as shown in FIG. 12 with more details.

In the above step S301, each memory cell is set to one of $2^3$ levels corresponding to a piece of three-bits data in one memory state among 8 memory states. The DC can store the programming data of one of the three logical pages (currently UP) of the first physical page before program verification of the 5th memory state LV4 of the 8 memory states, the D1 can store the programming data of the corresponding logical page (current LP) of the first physical page, and the D2 may store program data of the corresponding logical page (current MP) of the first physical page. Subsequently, the same encoding conversion as in FIG. 12 is performed on the programming data of different logical pages temporarily stored in the page latches. And after the LV4 program verification is passed, the page latch DC is released, so that the released page latch caches the program data of the lower page LP of the second physical page. The encoding state table can be referred to FIG. 13.

Step S302: Store the second non-physical page information in the bias latch in the page buffer. Here, the second non-physical page information includes voltage bias information of the corresponding bit line.

Step S303: in the process of programming the first physical page, disable the bit line bias function to release the bias latch to replace one of the N page latches, to perform program verification of the memory state, and release one of the N page latches. Prior to the second physical page being programmed in the second programming of the second physical page following the first programming in cache programming and during the first programming of the first physical page, store the program data of one of the N logical pages in the released page latches.

In the above step S303, the first programming/second programming is performed on the first physical page/second physical page, including using incremental step pulse programming ISPP programming method to program the 1st to $2^{(N-M)}$th memory states for programming operations.

In the above step S303, the disabling of the bit line bias function includes: the bit line bias function is disabled after program verification in the 3rd last memory state of the $2^N$ memory states. Specifically, referring to FIG. 26, the bit line bias function is disabled after program verification of the third-to-last memory state LV5 among the 8 memory states. FIG. 26 is an encoding state table provided by some implementations of the present application after disabling the bit line bias function. It can be seen that the bias latch DL is idle after disabling the bit line bias function, and can be used to replace a page latch for memory state identification. Then, the page latch D1 can be released to cache the program data of the lower page LP of the second physical page, thereby further releasing the page latch DC to cache the program data of the middle page MP of the second physical page.

In some implementations of the present application, after the bit line bias function is disabled, the step increment of the programming voltage is decreased. Since the bit line bias function itself is to reduce the width of the distribution of the threshold voltage of the memory cell, after the bit line bias function is disabled, it can be compensated by reducing the step increment of the programming voltage. In this way, a page latch can be replaced by a bias latch without affecting the function of the nonvolatile memory device.

In some implementations of the present application, after the program verification is performed on the penultimate memory state in the $2^N$ memory states, the N page latches are released, so that the N said page latches cache program data for each of the N logical pages of the second physical page.

In some implementations, after program verifying the penultimate of the 8th memory states (i.e., the 7th memory state (LV6) has been verified), release three of the page latches so that the three of the page latches cache the programming data of each of the three logical pages of the second physical page (next LP, next MP, next UP). The encoding state table is shown in FIG. 27. After the programming verification of LV6 is passed, there is still one memory state LV7 that has not passed the programming verification. Since a bit of each logical page has two possible states, 0 and 1, one latch has two possible states ($2^1$=2).

In other words, after the LV6 programming verification is passed, only one bias latch DL is needed to determine whether the LV7 programming verification is passed or not. Therefore, after the programming verification of LV6 is passed, the page latch D2 can be released to cache the programming data of the middle page MP of the second physical page. Thus, the page latch DC is further released to cache the program data of the upper page UP of the second physical page.

At this time, three page latches are released to store all the programming data of each page in the three logical pages of the second physical page. At this time, the page latch D1 caches the programming data of the lower page LP of the second physical page, the page latch D2 caches the program data of the middle page MP of the second physical page, and the page latch DC caches the program data of the upper page UP of the second physical page.

And then, whether DL is 1 can be used to determine whether LV7 has passed the programming verification. If DL is 1, it means that the LV7 programming verification is passed, which means that the segments corresponding to LV0-LV7 have been written to the selected memory cells, and the first programming is over. At this time, the programming data of the three logical pages to be written in the second programming have been cached in the page latch, and the second programming process can be directly entered. If DL is 0, it does not pass the programming verification. Since the three page latches can cache the programming data of each of the three logical pages (next LP, next MP, and next UP) of the second physical page after program verification at LV6. Thus, during the first programming operation, the second physical page may become ready. Therefore, at the end of the first programming operation, the second programming operation based on the second physical page can be seamlessly triggered without a data loading window.

Another non-volatile memory device is also provided in some implementations of the present application. After the peripheral circuit included in the nonvolatile memory device stores the programming data of four logical pages in the four page latches, the programming data of the logical page stored in the page latch is encoded and converted according to the preset, and the encoding state table shown in FIG. 21 is obtained.

In some implementations of the present application, before the program verification is performed on LV8 in the 16 memory states, the DC can store the programming data of one (current XP) of the four logical pages of the first physical page, the D1 can store the programming data of the corresponding logical page (current LP) of the first physical page, the D2 can store the programming data of the corresponding logical page (current MP) of the first physical page, and the D3 may store program data of the corresponding logical page (current UP) of the first physical page. After the LV8 programming verification is passed, the page latch DC is released, so that the released page latch caches the programming data of the lower page LP of the second physical page. The encoding state table is shown in FIG. 22. After the LV12 programming verification is passed, the page latch D1 is released to cache the programming data of the lower page LP of the second physical page. Thus, the page latch DC is further released to cache the program data of the middle page MP of the second physical page, and the encoding state table is shown in FIG. 23.

In some implementations of the present application, the peripheral circuit is further configured to: disable the bit line bias function after the program verification in the 3rd last memory state of the $2^N$ memory states.

In some implementations, after program verification of the third-to-last memory state LV13 of the 16 memory states, the bit line bias function is disabled to release the bias latch DL in place of the four page data latches a page latch in the memory for program verification of the memory state and to release one of the four page latches to cache the program data of one logical page of the four logical pages of the second physical page. And, in the process of programming the first physical page, the programming data of one logical page among the four logical pages of the second physical page is stored in a released page latch.

FIG. 29 is an encoding state table provided by some implementations of the present application after disabling the bit line bias function. It can be seen that the bias latch DL is idle after disabling the bit line bias function and thus can be used to replace one of the four page latches for programming verification of the memory state. Then the page latch D2 can be released to cache the programming data of the middle page MP of the second physical page. Thus, the page latch DC is further released to cache the program data of the upper page UP of the second physical page.

In some implementations of the present application, the peripheral circuit is further configured to after disabling the bit line bias function, decrease the step increment of the programming voltage. Since the bit line bias function itself is to reduce the width of the distribution of the threshold voltage of the memory cell, after the bit line bias function is disabled, it can be compensated by reducing the step increment of the programming voltage. In this way, one page latch of the data latch can be replaced by the bias latch, and the function of the nonvolatile memory device is not affected.

In some implementations of the present application, after program verification is performed on the penultimate memory state in the $2^N$ memory states, the N page latches are released, so that the N said page latches cache program data for each of the N logical pages of the second physical page.

In some implementations, after program verifying the penultimate of the 16 memory states (i.e., the 15th memory state (LV14) has been verified), release four of the page latches, so that the four page latches cache the programming data of each of the four logical pages (next LP, next MP, next UP, next XP) of the second physical page.

The encoding state table is shown in FIG. 30. After the programming verification of LV14 is passed, there is still one memory state LV15 that has not passed the programming verification. Since a bit of each logical page has two possible states, 0 and 1, one latch has two possible states ($2^1=2$). In other words, after the LV6 programming verification is passed, only one bias latch DL is needed to determine whether the LV7 programming verification is passed or not. Therefore, after the programming verification of LV14 is passed, the page latch D3 can be released to cache the programming data of the upper page UP of the second physical page. Thus, the page latch DC is further released to cache the program data of the extra page XP of the second physical page.

At this time, four page latches are released to store all the programming data of each page in the four logical pages of the second physical page. At this time, the page latch D1 caches the program data of the lower page LP of the second physical page, the page latch D2 caches the program data of the middle page MP of the second physical page, the page latch D3 caches the program data of the upper page UP of the second physical page, and the page latch DC caches the program data of the extra page XP of the second physical page. And then, whether DL is 1 can be used to determine whether LV15 has passed the programming verification. If DL is 1, it means that the LV15 programming verification is passed, which means that the segments corresponding to LV0-LV15 have been written to the selected memory cells, and the first programming is over. At this time, the programming data of the four logical pages to be written in the second programming have been cached in the four page latches, and the second programming process can be directly entered.

If DL is 0, the program verification is not passed, and the program verification determination continues.

The solutions provided by some implementations of the present application enable the programming data of various types of logical pages required in the second programming to be temporarily stored in the page latches during the first programming. That is, during the first programming operation, the second physical page may become ready. Therefore, at the end of the first programming operation, the second programming operation based on the second physical page can be seamlessly triggered without a data loading window.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

What is claimed is:

1. A memory device, comprising:
a memory cell array, wherein the memory cells in the memory cell array are arranged in rows and columns, and each memory cell is set to one of $2^N$ levels corresponding to a piece of N-bits data, where N is an integer greater than 1; and
a peripheral circuit coupled to the memory cell array and configured to:
perform first programming and second programming sequentially and respectively on the memory cell array in a first physical page and a second physical page in a cache programming manner, and
program at least a selected row of the memory cells based on N logical pages of the first physical page and the second physical page during the first programming and the second programming, wherein the peripheral circuit comprises page buffers respectively coupled to bit lines, each page buffer comprising:
a main latch, (N−1) data latches, and a cache latch coupled to a data path,
wherein the main latch is configured to store first non-physical page information, and the (N−1) data latches and the cache latch are configured to, during a process of programming to the N logical pages of the first physical page and the second physical page, function as N page latches to temporarily store programming data to be written into the N logical pages,
wherein the peripheral circuit is further configured to:
in the process of programming the first physical page, perform a programming verification to the programming corresponding to the $2^{(N-M)}$ th memory state;
when the program verification of the $2^{(N-M)}$ th memory state is passed, identifiers corresponding to the 1st to $2^{(N-M)}$ th memory states stored by the main latch are made different from those corresponding to the $2^{(N-M)}+1$st to $2^N$ th memory states;
release at least one of the N page latches to cache program data of at least one logical page of the N logical pages of the second physical page; and
in the process of programming the first physical page, the programming data of one logical page in the N logical pages of the second physical page is stored in a released page latch, where M is an integer greater than or equal to 1 and less than or equal to (N−2).

2. The memory device of claim 1, wherein the peripheral circuit is further configured to:
during the programming of the first physical page and the second physical page, the 1st to $2^{(N-M)}$th memory states are programmed using an incremental step pulse programming (ISPP) programming method.

3. The memory device of claim 1, wherein the first non-physical page information comprises verification information and programming information.

4. The memory device of claim 1, wherein the peripheral circuit is further configured to:
after the program verification is performed on $2^{N-1}$th memory state of the $2^N$ memory states, the identifiers corresponding to the 1st to $2^{(N-1)}$th memory states stored by the main latch are made different from those corresponding to the $2^{(N-1)}+1$st to $2^N$th memory states; or
after the program verification of a third-to-last memory state of the $2^N$ memory states, the identifiers corresponding to the 1st to $2^{N-2}$nd memory states stored by the main latch are made different from those corresponding to the $2^{N-1}$th to $2^N$th memory states.

5. The memory device of claim 4, wherein the peripheral circuit is also configured to:
after the identifiers corresponding to the 1st to $2^{(N-M)}$th memory states stored by the main latch are made different from the identifiers corresponding to the $2^{(N-M)}+1$st to $2^N$th memory states, float the bit line during the process of programming to dump the first non-physical page information in the main latch.

6. The memory device of claim 4, wherein the peripheral circuit is also configured to:
before program verification is performed on the $2^{N-1}$th memory state of the $2^N$ memory states, store program data of a corresponding one of the N logical pages of the first physical page in at least one of the N page latches; and after program verification is performed on the $2^{N-1}$th memory state of the $2^N$ memory states, store program data of one of the N logical pages of the second physical page in at least one of the N page latches.

7. The memory device of claim 6, wherein the peripheral circuit is further configured to:
after program verifying a second-to-last of the $2^N$ memory states, release the N page latches so that the N page latches cache program data of each of the N logical pages of the second physical page.

8. The memory device of claim 1, wherein
each memory cell is configured to store three-bit data;
the peripheral circuit is further configured to program the selected row of memory cells based on three logical pages of the first physical page and the second physical page; and
two data latches and the cache latch are configured to function as three page latches in the process of performing a programming process on the three logical pages of the first physical page and the second physical page, to temporarily store the programming data to be written into the three logical pages.

9. The memory device of claim 1, wherein
each memory cell is configured to store four-bit data;
the peripheral circuit is further configured to program the selected row of memory cells based on four logical pages of the first physical page and the second physical page; and
three data latches and the cache latch are configured to function as four page latches in the process of performing a programming process on the four logical pages of the first physical page and the second physical page, to temporarily store the programming data to be written into the four logical pages.

10. The memory device of claim 1, wherein each page buffer further comprises a bias latch coupled to the data path and configured to store voltage bias information of a corresponding bit line, or second non-physical page information.

11. A memory device, comprising:
a memory cell array, wherein the memory cells in the memory cell array are arranged in rows and columns, and each memory cell is set to one of $2^N$ levels corresponding to a piece of N−bits data, where N is an integer greater than 1; and
a peripheral circuit coupled to the memory cell array and configured to:
perform first programming and second programming sequentially and respectively on the memory cell array in a first physical page and a second physical page in a cache programming manner, and
program at least a selected row of the memory cells based on N logical pages of the first physical page and the second physical page during the first programming and the second programming,
wherein the peripheral circuit comprises page buffers respectively coupled to bit lines, each page buffer comprising:
ches and the cache latch are configured to:
during a process of programming to the N logical pages of the first physical page and the second physical page, function as N page latches to temporarily store programming data to be written into the N logical pages,
wherein the peripheral circuit is further configured to:
in the process of programming the first physical page, perform a programming verification to the programming corresponding to the $2^{(N-M)}+1$st memory state;

when the program verification of the $2^{(N-M)}+1$st memory state is passed,
release at least one of the N page latches to cache program data of at least one logical page of the N logical pages of the second physical page; and
in the process of programming the first physical page, the programming data of one logical page in the N logical pages of the second physical page is stored in a released page latch, where M is an integer greater than or equal to 1 and less than or equal to (N−2).

12. The memory device of claim 11, wherein the each page buffer further comprises a main latch configured to store first non-physical page information, wherein the peripheral circuit is also configured to:
after the program verification of a third-to-last memory state of the $2^N$ memory states, float the bit line during the process of programming to dump the first non-physical page information in the main latch, and the identifiers corresponding to the 1st to $2^{N-2}$nd memory states stored by the main latch are made different from those corresponding to $2^{N-1}$st to the $2^N$th memory state.

13. The memory device of claim 12, wherein the peripheral circuit is further configured to:
after the program verification of a second-to-last memory state of the $2^N$ memory states, the identifiers corresponding to the 1st to $2^{N-1}$st memory states stored by the main latch are made different from those corresponding to the $2^N$th memory state.

14. A method of programming a memory device, wherein the memory device comprises a memory cell array and a peripheral circuit coupled to the memory cell array, wherein memory cells in the memory cell array are arranged in rows and columns, and each memory cell is set to one of $2^N$ levels corresponding to a piece of N-bits data, where N is an integer greater than 1, wherein the peripheral circuit comprises a plurality of page buffers coupled to bit lines, respectively, wherein the method comprises:
storing N logical pages of first physical page corresponding to a current first programming in the N page latches, wherein the N page latches comprise (N−1) data latches in the page buffers and a cache latch coupled to a data path;
storing first non-physical page information in a main latch in the page buffers;
in a first programming of a first physical page, performing a program verification on a process of programming corresponding to the $2^{(N-M)}$th memory state;
when the program verification of the $2^{(N-M)}$th memory state is passed, making identifiers corresponding to the 1st to $2^{(N-M)}$th memory states stored by the main latch to be different from those corresponding to $2^{(N-M)}+1$st to $2^N$th memory states;
releasing at least one of the N page latches to cache program data of at least one logical page of the N logical pages of a second physical page, where M is an integer greater than or equal to 1 and less than or equal to (N−2); and
before performing a second programming subsequent to the first programming to the second physical page in the cache programming manner, and in the process of first programming the first physical page, storing the programming data of one of the N logical pages of the second physical page in a released page latch.

15. The method of claim 14, wherein performing the first programming and the second programming on the first physical page and the second physical page comprises:
programming the 1st to $2^{(N-M)}$th memory states by using an incremental step pulse programming (ISPP) programming method.

16. The method of claim 14, wherein the first non-physical page information comprises verification information and programming information.

17. The method of claim 14, wherein when the program verification of the $2^{(N-M)}$th memory state is passed, the identifiers corresponding to the 1st to $2^{(N-M)}$th memory states stored by the main latch to be different from those corresponding to $2^{(N-M)}+1$st to $2^N$th memory states, further comprises:
after the program verification is performed on the $2^{N-1}$st memory state of $2^N$ memory states, the identifiers corresponding to 1st to $2^{N-}$)th memory states stored by the main latch are made different from those identifiers corresponding of $2^{(N-M)}+1$st to $2^N$th memory states; or
after program verification is performed on the third-to-last memory state of the $2^N$ memory states, the identifiers corresponding to 1st to $2^{N-2}$nd memory states stored in the main latch are made different from those corresponding to $2^{N-1}$th to $2^N$th memory states.

18. The method of claim 17, wherein after the identifiers corresponding to the 1st to $2^{(N-M)}$th memory states stored by the main latch to be different from those corresponding to $2^{(N-M)}+1$st to $2^N$th memory states, the method further comprises:
floating the bit line during the process of programming to dump the first non-physical page information in the main latch.

19. The method of claim 18, further comprising:
before the program verification is performed on the $2^{N-1}$st memory state of $2^N$ memory states, storing program data of one of the N logical pages of the first physical page in at least one of the N page latches; and
after the program verification is performed on the $2^{N-1}$st memory state of $2^N$ memory states, storing program data of one of the N logical pages of the second physical page in at least one of the N page latches.

20. The method of claim 19, further comprising:
after program verification is performed on the third-to-last memory state of the $2^N$ memory states, release the N page latches, so that the N page latches cache program data of each of the N logical pages of the second physical page.

* * * * *